US008257997B2

(12) United States Patent
Chen et al.

(10) Patent No.: US 8,257,997 B2
(45) Date of Patent: Sep. 4, 2012

(54) SEMICONDUCTOR PHOTODETECTORS

(75) Inventors: Liang Chen, Woburn, MA (US);
Chingyin Hong, Lexington, MA (US);
Fuwan Gan, Woburn, MA (US); Dong Pan, Andover, MA (US)

(73) Assignee: Sifotonics Technologies (USA) Inc., Woburn, MA (US)

( * ) Notice: Subject to any disclaimer, the term of this patent is extended or adjusted under 35 U.S.C. 154(b) by 641 days.

(21) Appl. No.: 12/253,497

(22) Filed: Oct. 17, 2008

(65) Prior Publication Data

US 2009/0101909 A1 Apr. 23, 2009

Related U.S. Application Data

(60) Provisional application No. 60/999,304, filed on Oct. 17, 2007, provisional application No. 60/999,317, filed on Oct. 17, 2007.

(51) Int. Cl.
*H01L 31/062* (2006.01)
*H01L 31/113* (2006.01)
*H01L 21/00* (2006.01)

(52) U.S. Cl. .............. 438/71; 257/290; 257/E31.032

(58) Field of Classification Search .......... 257/228, 257/226, 444, 447, 460, 466, E31.032, 292; 438/71
See application file for complete search history.

(56) References Cited

U.S. PATENT DOCUMENTS

| | | | | |
|---|---|---|---|---|
| 5,311,038 A * | 5/1994 | Yamamoto et al. | ............. | 257/40 |
| 5,598,016 A * | 1/1997 | Tanabe et al. | ............. | 257/229 |
| 6,329,679 B1 * | 12/2001 | Park | ............. | 257/233 |
| 6,352,942 B1 | 3/2002 | Luan | | |
| 6,369,417 B1 * | 4/2002 | Lee | ............. | 257/294 |
| 6,458,881 B1 * | 10/2002 | Pan et al. | ............. | 524/490 |
| 6,821,793 B2 * | 11/2004 | Verdonk | ............. | 257/291 |
| 6,921,681 B2 * | 7/2005 | Sun et al. | ............. | 438/69 |
| 7,071,505 B2 * | 7/2006 | Rhodes | ............. | 257/292 |
| 7,217,983 B2 * | 5/2007 | Suzuki | ............. | 257/444 |
| 7,232,698 B2 * | 6/2007 | Kim | ............. | 438/48 |
| 7,262,117 B1 * | 8/2007 | Gunn et al. | ............. | 438/481 |
| 7,294,522 B2 * | 11/2007 | Shim | ............. | 257/219 |
| 7,364,933 B2 * | 4/2008 | Kim | ............. | 438/65 |
| 7,417,268 B2 * | 8/2008 | Cazaux et al. | ............. | 257/225 |
| 7,419,844 B2 * | 9/2008 | Lee | ............. | 257/291 |
| 7,541,212 B2 * | 6/2009 | Oh | ............. | 438/48 |
| 7,576,361 B2 * | 8/2009 | Agranov et al. | ............. | 257/66 |
| 7,683,408 B2 * | 3/2010 | Hong | ............. | 257/292 |

(Continued)

OTHER PUBLICATIONS

Kelley et al. "A digital linescan camera with embedded micro-processor" WESCON/96 Oct. 22, 1996 pp. 405-409.*

(Continued)

*Primary Examiner* — N Drew Richards
*Assistant Examiner* — Grant Withers
(74) *Attorney, Agent, or Firm* — Occhiuti Rohlicek & Tsao LLP

(57) ABSTRACT

In one aspect, a method includes forming a pit in a top surface of a substrate by removing a portion of the substrate and growing a semiconductor material with a bottom surface on the pit, the semiconductor material different than the material of the substrate. The pit has a base recessed in the top surface of the substrate. In another aspect, a structure includes a substrate having a top surface, the substrate including at least one pit having a base lower than the top surface of the substrate, and a semiconductor material having a bottom surface formed on the base of the pit.

52 Claims, 30 Drawing Sheets

U.S. PATENT DOCUMENTS

| | | | |
|---|---|---|---|
| 7,714,403 B2* | 5/2010 | Lee et al. ............... 257/432 |
| 7,781,715 B2* | 8/2010 | Uya et al. ............... 250/208.1 |
| 7,785,909 B2* | 8/2010 | Ryu ....................... 438/29 |
| 7,875,948 B2* | 1/2011 | Hynecek et al. ........ 257/447 |
| 7,973,346 B2* | 7/2011 | Park ...................... 257/292 |
| 2001/0032988 A1* | 10/2001 | Yoshida et al. ......... 257/226 |
| 2002/0145683 A1* | 10/2002 | Murade et al. ......... 349/43 |
| 2006/0086955 A1* | 4/2006 | Iwata ..................... 257/226 |
| 2006/0113542 A1 | 6/2006 | Isaacson |
| 2007/0025670 A1 | 2/2007 | Pan |
| 2007/0105251 A1 | 5/2007 | Liu et al. |
| 2007/0116398 A1 | 5/2007 | Pan et al. |
| 2008/0203516 A1* | 8/2008 | Shin ....................... 257/444 |
| 2009/0189235 A1* | 7/2009 | Ikeda et al. ............ 257/432 |
| 2009/0224345 A1* | 9/2009 | Lee et al. ............... 257/432 |
| 2010/0219733 A1* | 9/2010 | Wan et al. .............. 313/10 |
| 2010/0301439 A1* | 12/2010 | Yamamoto et al. .... 257/432 |

OTHER PUBLICATIONS

Schlafer et al. "A hermetic fiber-coupled p-i-n. photodetector package for use in fiber-optic preamplifier circuits" Elec. Dev., IEEE Trans. on, Dec. 1985 vol. 32 Iss:12 pp. 2713-2715.*

Masini et al. "Ge photodetectors integrated in CMOS photonic circuits", Silicon Photonics III, edited by Joel A. Kubby, Graham T. Reed, Proc. of SPIE vol. 6898, (2008), 6 pages.

Mekis et al. "Monolithic integration of photonic and electronic circuits in a CMOS process," Optoelecronic Integrated Circuits X, edited by Louay A. Eldada, El-Hang Lee, Proc. of SPIE vol. 6897, 68970L, (2008), 14 pages.

Masini et al. "High-Speed Near Infrared Optical Receivers Based on GE Waveguide Photodetectors Integrated in a CMOS Process" Hindawi Publishing Corporation, Advances in Optical Technologies, vol. 2008, Article ID 196572, 5 pages.

Pinguet et al. "40 Gbps Monolithically Integrated Transceivers in CMOS Photonics", Silicon Phtonics III, edited by Joel A. Kubby, Graham T. Reed, Proc. of SPIE, vol. 6898, (2008), 14 pages.

Liu et al. "Tensile strained Ge $p$-$i$-$n$ photodetectors on Si platform for C and L band telecommunications", Applied Physics Letters 87, 011110 (2005), 3 pages.

Liu et al. "High-performance, tensile-strained Ge $p$-$i$-$n$ photodetectors on a Si platform", Applied Physics Letters 87, 103501 (2005), 3 pages.

Colance et al. "Ge on Si $p$-$i$-$n$ photodiodes operating at 10 Bbit/s", Applied Physics Letters 88, 101111 (2006), 3 pages.

Oehme et al. "High bandwidth Ge $p$-$i$-$n$ photodetector integrated on Si", Applied Physics Letters 89, 071117 (2006), 3 pages.

Ahn et al. "High performance, waveguide integrated Ge photodetectors", Apr. 2, 2007/vol. 15, No. 7/Optics Express 3916, 6 pages.

Vivien et al. "High speed and high responsively germanium photodetector integrated in a Silicon-On-Insulator microwaveguide", Jul. 23, 2007/vol. 15, No. 15, Optics Express 9843.

Yang et al. "A High-Speed, High-Sensitivity Silicon Lateral Trench Photodetector", IEEE Electron Device Letters, vol. 23, No. 7, Jul. 2002, pp. 395-397.

Schow et al. "A 15-Gb/s 2.4-V Optical Receiver Using a Ge-on-SOI Photodiode and a CMOS IC", IEEE Photonics Technology Letters, vol. 18, No. 19, Oct. 1, 2006, pp. 1981-1983.

Dehlinger et al. "High-speed germanium-on SOI lateral PIN photodiodes", IEEE Photonics Technology Letters, vol. 16, No. 11, Nov. 2004, pp. 2547-2549.

Wang et al. "Integration of Tensile-Strained Ge $p$-$i$-$n$ Photodetector on Advanced CMOS Platform", IEEE 2007, pp. 52-54, Sep. 19, 2007.

Morse et al. "Performance of Ge-on-Si p-i-n Photodetectors for Standard Receiver Modules", IEEE Photonics Technology Letters, vol. 18, No. 23, Dec. 1, 2006, pp. 2442-2444.

Morse et al. "Progress Towards Competitive Ge/Si Photodetectors", Proc. of SPIE, vol. 6996, 11 pages, Apr. 7, 2008.

Reshotko et al. "Waveguide Coupled Ge-on-Oxide Photodetectors for Integrated Optical Links", IEEE, 2008, pp. 182-184.

Vivien et al. "42 GHz waveguide Germanium-on-silicon vertical PIN photodetector", IEEE, 2008, pp. 185-187.

Klinger et al. "Ge on Si $p$-$i$-$n$ Photodetectors with 40 GHz bandwidth", IEEE, 2008, pp. 188-190.

Suh et al. "35 GHz Ge $p$-$i$-$n$ Photodetectors Implemented Using RPCVD", IEEE, 2008, pp. 191-193.

* cited by examiner

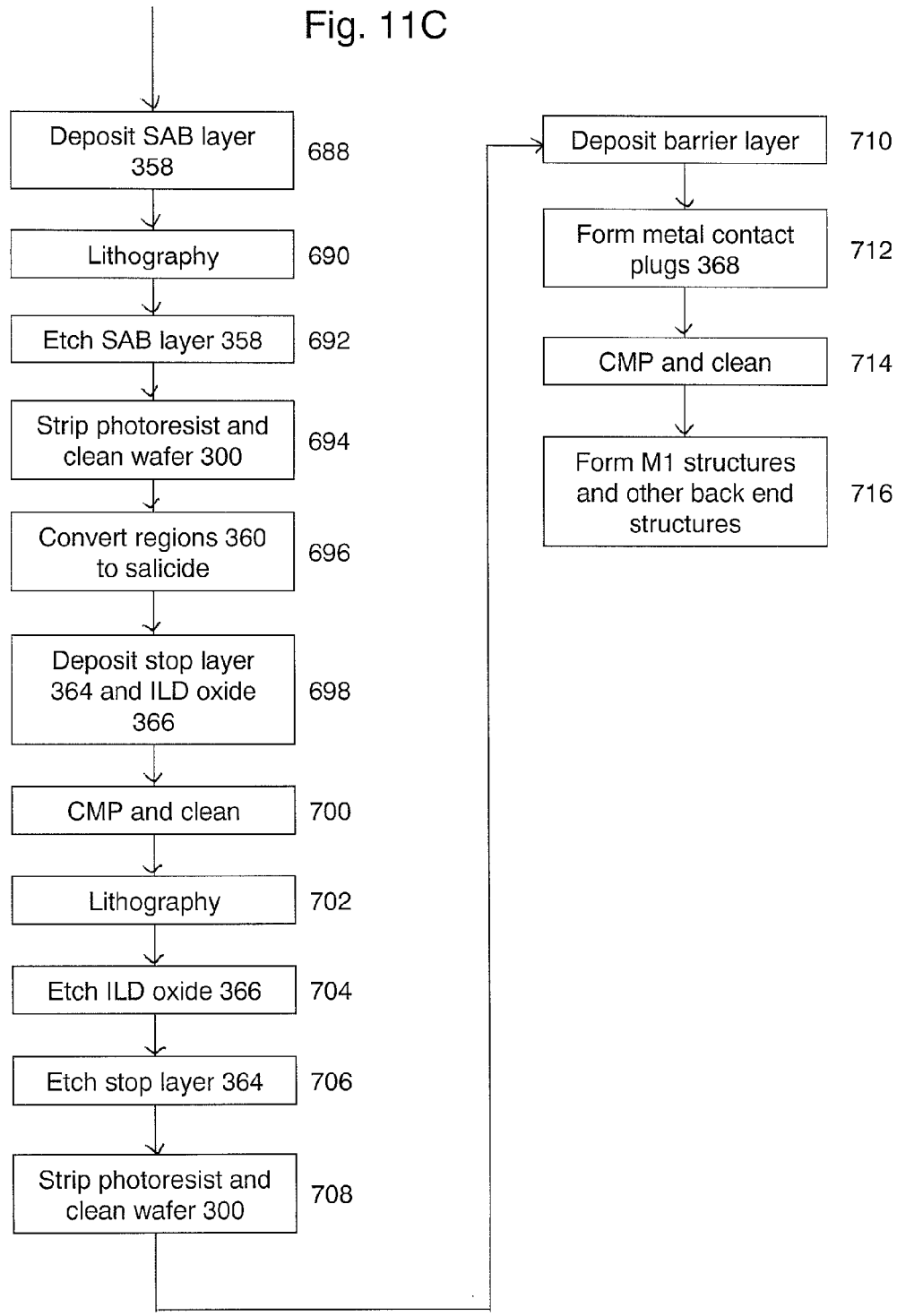

Note: In Fig. 17, 330 and 304 are the same region.

SEMICONDUCTOR PHOTODETECTORS

CROSS-REFERENCE TO RELATED APPLICATIONS

This application claims priority to U.S. provisional application No. 60/999,304, filed Oct. 17, 2007, and entitled "Method of Fabrication of Ge or SiGe photo detector by selective growth on bulk Si or SOI wafer;" and to U.S. provisional application No. 60/999,317, filed Oct. 17, 2007, and entitled "Method of selectively growing Ge or SiGe materials on bulk Si or SOI wafer," both of which are incorporated herein by reference.

FIELD OF THE INVENTION

This invention relates to semiconductor photodetectors.

BACKGROUND

High density photonic lightwave circuits have been the subject of significant investigation recently. High index contrast waveguide-based devices (e.g., modulators or attenuators) and devices such as photodetectors and modulators formed from silicon-compatible materials (e.g., germanium or SiGe) are fabricated using complementary metal-oxide-semiconductor (CMOS) processing technology onto silicon or silicon-on-insulator (SOI) substrates. For instance, photodetectors formed of one or more layers of Ge or SiGe on a Si substrate that detects light incident from the top or bottom of the substrate have been studied. Such photodetectors, when monolithically integrated with CMOS integrated circuits on the same substrate, are often fabricated from thin films of Ge and SiGe that are inefficient at absorbing incident light from the top or bottom of the substrate.

SUMMARY

In a general aspect, a method includes forming a pit in a top surface of a substrate by removing a portion of the substrate and growing a semiconductor material with a bottom surface on the pit, the semiconductor material different than the material of the substrate. The pit has a base recessed in the top surface of the substrate.

Embodiments of the method may include one or more of the following features. Growing the semiconductor includes forming a photodetector. The method includes forming active electronic components on the top surface of the substrate, the active electronic components electrically coupled to the photodetector. The method includes doping at least a portion of the base of the pit prior to growing the semiconductor material. The at least a portion of the base of the pit is configured to be an electrode of the semiconductor material. The method further includes annealing the substrate after growing the semiconductor material. The anneal is performed between 700° C. and 900° C.

The method includes forming a dielectric layer on top of at least a portion of the substrate prior to growing the semiconductor material, the portion of the substrate including the pit; and generating a hole in the dielectric layer in the region of the pit. The semiconductor material is grown in the hole in the dielectric layer. The method further includes performing a chemical mechanical polish process after growing the semiconductor material. The dielectric layer includes at least one of silicon dioxide ($SiO_2$), silicon oxide ($SiO_x$), silicon nitride ($Si_xN_y$), or silicon oxynitride ($SiO_xN_y$). The dielectric layer includes a plurality of sublayers, each sublayer including at least one of silicon dioxide ($SiO_2$), silicon oxide ($SiO_x$), silicon nitride ($Si_xN_y$), or silicon oxynitride ($SiO_xN_y$).

The pit is formed by at least one of dry chemical etching, wet chemical etching, dry thermal oxidation, or wet thermal oxidation. Forming the pit includes depositing a mask on the top surface of the substrate, oxidizing the portion of the substrate to be removed by wet or dry oxidation, and removing at least a part of an oxide formed by the oxidation of the portion of the substrate. The mask defines the portion of the substrate to be removed. The oxide is removed by chemical mechanical polishing or at least one of wet chemical etching or dry chemical etching. The mask includes at least one of silicon nitride ($Si_xN_y$), silicon oxynitride ($SiO_xN_y$), silicon dioxide ($SiO_2$), or silicon oxide ($SiO_x$).

The method further includes fabricating an integrated circuit on the top surface of the substrate. The integrated circuit is fabricated using CMOS processing or CMOS compatible processing. The step of growing the semiconductor material occurs after front-end processing of the integrated circuit and prior to back-end processing of the integrated circuit. Front-end processing includes fabricating at least one metal-oxide-semiconductor (MOS) transistor. The bottom surface of the semiconductor material is lower than a bottom surface of a gate oxide of the at least one MOS transistor, such as at least 50 nm lower or at least 200 nm lower than the bottom surface of the gate oxide of the at least one MOS transistor. A top surface of the semiconductor material is higher than the top surface of the substrate and lower than a top surface of the at least one MOS transistor. Back-end processing includes fabricating at least one layer of metal interconnects. A top surface is lower than or at substantially the same level as a bottom surface of a lowest layer of metal interconnects.

The method includes growing polysilicon or amorphous silicon on top of or on at least one side of the semiconductor material. The method further includes doping at least a portion of the polysilicon or amorphous silicon. The at least a portion of the polysilicon or amorphous silicon is configured to be an electrode of the semiconductor material. The semiconductor material includes a photodetector.

The semiconductor material has a lateral size of between 50 μm and 75 μm, or of less than 50 μm. The semiconductor material includes Ge or SiGe. The semiconductor material is grown to a thickness of at least 0.5 μm. The semiconductor material is grown through a chemical vapor deposition (CVD) process, such as a low pressure CVD process or a high vacuum CVD process. The substrate includes silicon or silicon-on-insulator.

In another general aspect, a structure includes a substrate having a top surface, the substrate including at least one pit having a base lower than the top surface of the substrate, and a semiconductor material having a bottom surface formed on the base of the pit.

Embodiments of the structure may include one or more of the following features. The semiconductor material is a photodetector. An efficiency of the photodetector is at least 95%. The structure further includes active electronic components formed on the top surface of the substrate, the active electronic components electrically coupled to the photodetector. At least a portion of the base of the pit is doped. The at least a portion of the base of the pit is configured to be an electrode of the semiconductor material. The semiconductor material includes Ge or SiGe. The semiconductor material is at least 0.5 μm thick. The semiconductor material has a lateral size of between 50 μm and 75 μm, or of less than 50 μm. The structure includes a layer of an insulator substantially covering the substrate. The substrate includes silicon or silicon-on-insulator.

The structure includes an integrated circuit fabricated on the top surface of the substrate. The integrated circuit includes at least one MOS transistor. A top surface of the semiconductor material is higher than the top surface of the substrate and lower than a top surface of the at least one MOS transistor. The integrated circuit includes at least one layer of metal interconnects. A top surface of the semiconductor material is lower than or at substantially the same level as a bottom surface of a lowest layer of metal interconnects.

The structure further includes a layer of polysilicon or amorphous silicon on top of or on at least one side of the semiconductor material. At least a portion of the polysilicon or amorphous silicon is doped. The at least a portion of the polysilicon or amorphous silicon is configured to be an electrode of the semiconductor material. The semiconductor material includes a photodetector.

In a further general aspect, an electro-optical system includes at least one integrated device including a photodetector body and active electronic components electrically coupled to the photodetector body. The photodetector body has a thickness selected to enable fabrication of the active electronic components.

Embodiments of the electro-optical system may include one or more of the following features. The electro-optical system includes an optical fiber coupled to the photodetector body. The electro-optical system includes a plurality of integrated devices. The active electronic components are configured to amplify and to reshape a signal detected by the photodetector body. The active electronic components include a digital microprocessor.

Embodiments may include one or more of the following advantages.

In some examples, a Ge or SiGe photodetector fabricated on a wafer and configured to detect light coming from the top or bottom of the wafer is between approximately 900 nm and several micrometers in thickness in order for the photodetector to absorb 95% of incoming light having a wavelength between approximately 0.85 µm and 1.5 µm. The height of a first metallization layer (M1) in a CMOS integrated circuit is often less than an optimal thickness of the photodetector. For example, the height of the M1 layer is typically about 500 nm above the top surface of the substrate for a typical 0.13 µm CMOS foundry processing line. More advanced CMOS processing lines may have even lower heights. Growing a photodetector in a pit in the substrate (e.g., a pit having a depth of at least 400 nm) can recess the photodetector so that its height above the top surface of the substrate is lower than the height of the M1 layer. This compatibility in height of the photodetector and the M1 layer enables standard CMOS processing techniques.

High-temperature front-end processing of MOS transistors (e.g., fabrication of the poly gate structures), which often exceeds 950° C., can be completed before the fabrication of the photodetector, which cannot endure such high temperatures. The growth and optional anneal of the photodetector then requires processing at temperatures in the range of 600° C. to 900° C., which is too high for the back-end processing of metal interconnects. Thus, the back-end processing can be performed after the growth and anneal of the photodetector. This process sequence, in which the growth and anneal of the photodetector is performed after front-end processing but before back-end processing, is enabled by the structure and height of the photodetector. Since the top surface of the photodetector is at a level lower than the M1 layer, standard CMOS processing techniques, such as chemical mechanical polish (CMP) steps, are possible for the fabrication of back-end structures. Furthermore, existing models and designs for integrated circuit components can be preserved while integrating an efficient photodetector onto the same substrate as the integrated circuit components. For instance, the height compatibility allows a standard integrated circuit design including the digital integrated circuit design for the M1 layer to be used.

DETAILED DESCRIPTION

Figure 1A:
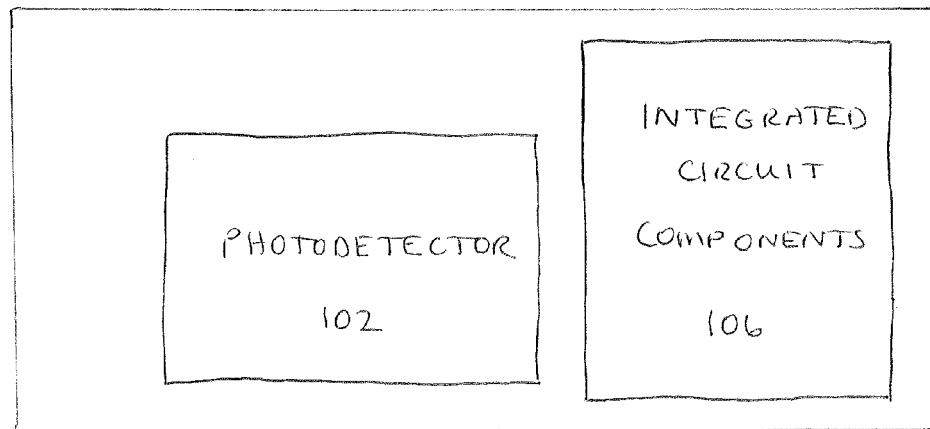
FIGS. 1A-1B are top view and cross-sectional view schematic diagrams of a photodetector and an integrated circuit fabricated on a single wafer.
Figure 1B:
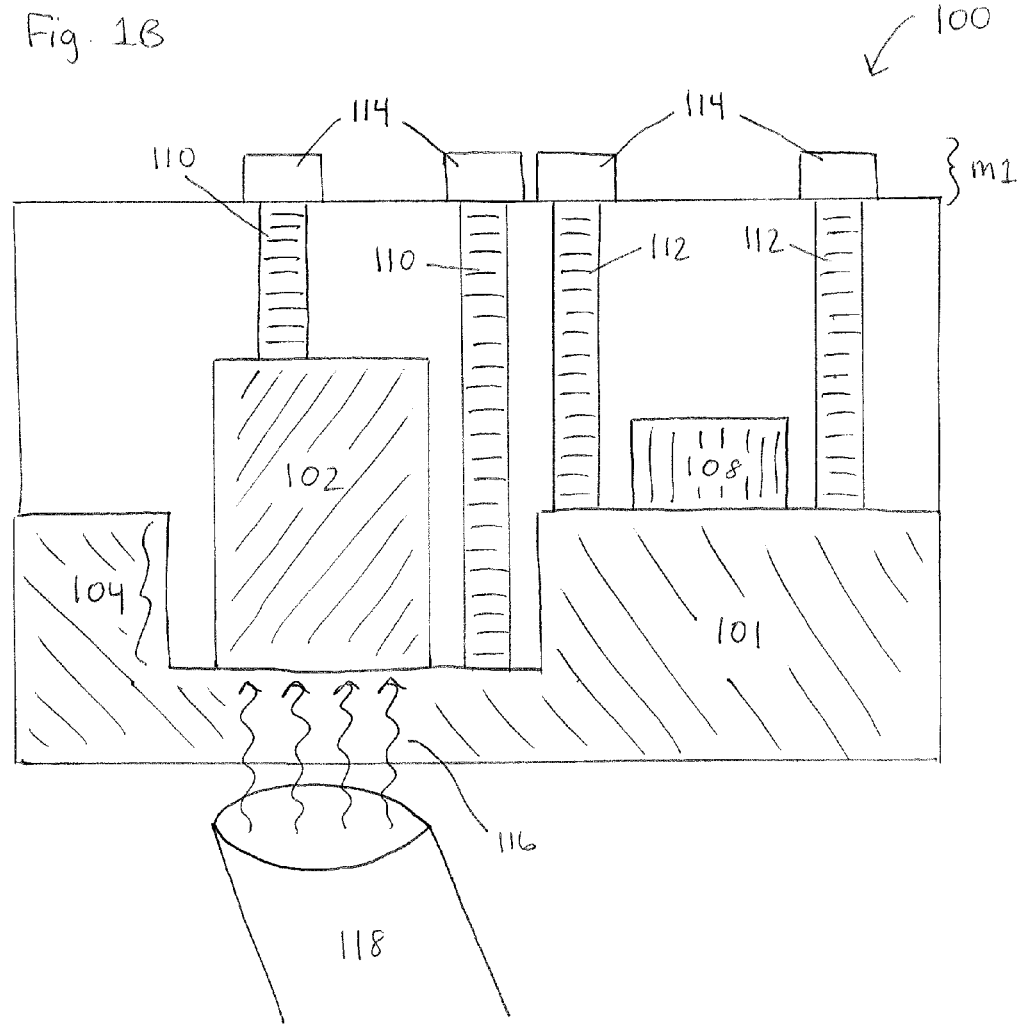

Referring to FIGS. 1A and 1B, an integrated circuit 100 includes a photodetector body 102 and complementary metal-oxide-semiconductor (CMOS) integrated circuit components 106 fabricated on a single substrate 101. Integrated circuit components 106 may include transistors, such as a representative metal-oxide-semiconductor (MOS) transistor 108; conductive interconnects, such as metal plugs 110 and 112, metal plugs (not shown) to a gate of MOS transistor 108, and metal lines 114 in metallization layer M1, and other standard components of integrated circuits. Photodetector body 102 is formed of germanium (Ge) or silicon germanium (SiGe) and preferably has a thickness of 0.5 µm to 2.5 µm. To accommodate this thickness, a pit 104 is formed in substrate 101 such that the base of photodetector body 102 is lower than a top surface of substrate 101. The top of photodetector body 102 is lower than a bottom surface of metal lines 114 in metallization layer M1, and preferably at a similar level as integrated circuit components 106. For instance, the top of photodetector body is preferably at a level between a top surface of substrate 101 and a top surface of a gate of MOS transistor 108. This height configuration enables standard designs for integrated circuit components 106 and standard complementary metal-oxide-silicon (CMOS) processing techniques to be used for integrated circuit fabrication processes. That is, for instance, metallization layer M1 is fabricated based on standard or existing integrated circuit designs. In general, the fabrication steps described below use standard CMOS processing procedures and parameters.

Photodetector body 102 can be configured to detect light incoming from the top or bottom of the substrate, incident vertically or at an angle. In the example shown in FIG. 1B, light 116 is incident on photodetector body 102 from the bottom of substrate 101 via an optical fiber 118. In the configuration of integrated circuit 100, the cross-sectional size of photodetector body 102 can be made with a dimension selected for a desired application. For instance, photodetector body 102 can have a cross-sectional size as low as 10 µm to 75 µm to match the size of a single mode optical fiber or a multimode optical fiber, or in the range of several hundred micrometers to match the size of a polymer optical fiber, or even as large as several millimeters for use as an optical-to-electrical power converter. In one example, the cross-sectional size of photodetector body may be in the range of 50-75 µm, which matches the core size of a standard multimode optical fiber (typically 50 µm or 62.5 µm).

Figure 2:
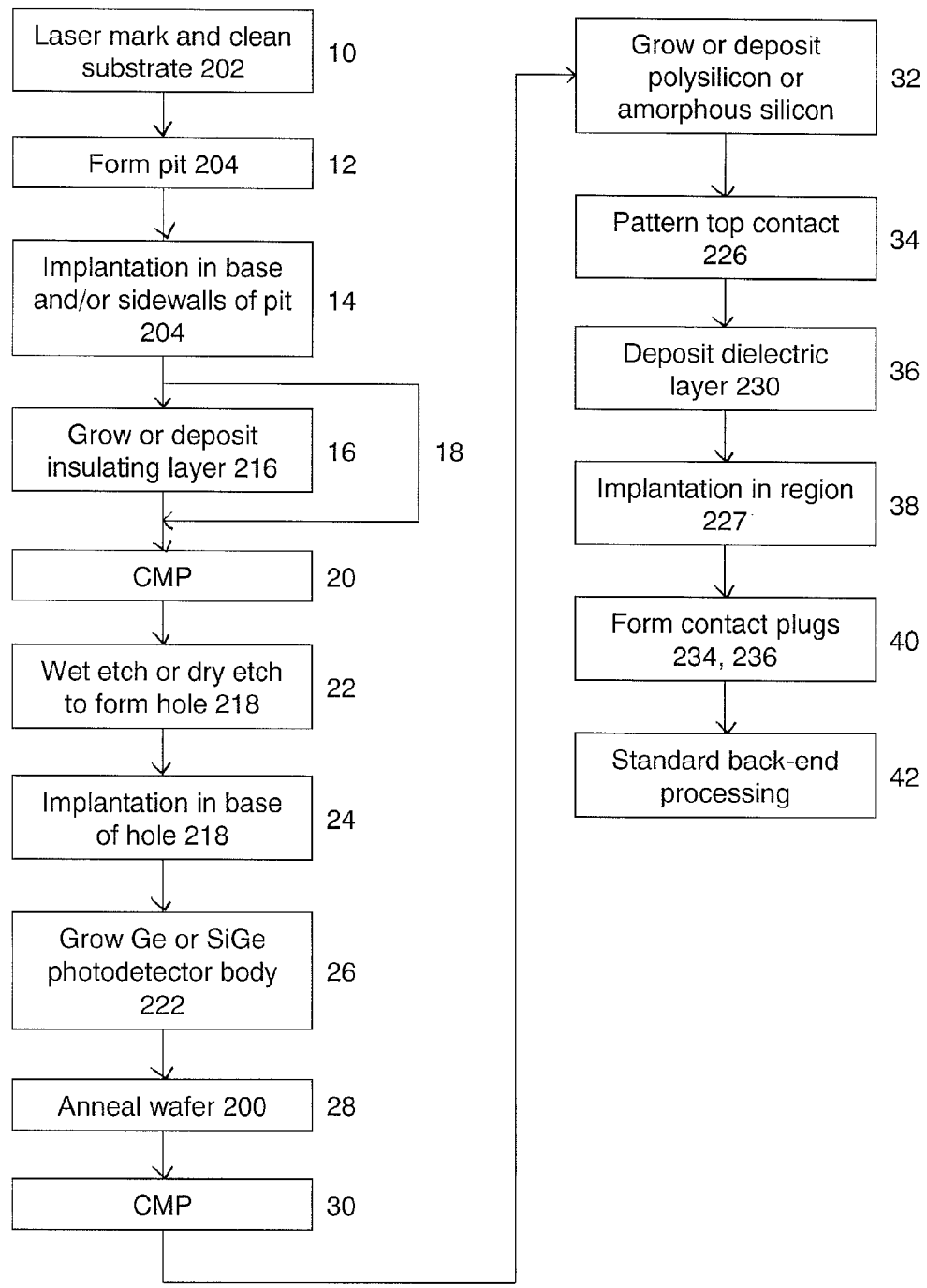
FIG. 2 is a flow diagram of a general fabrication process.
Figure 3:
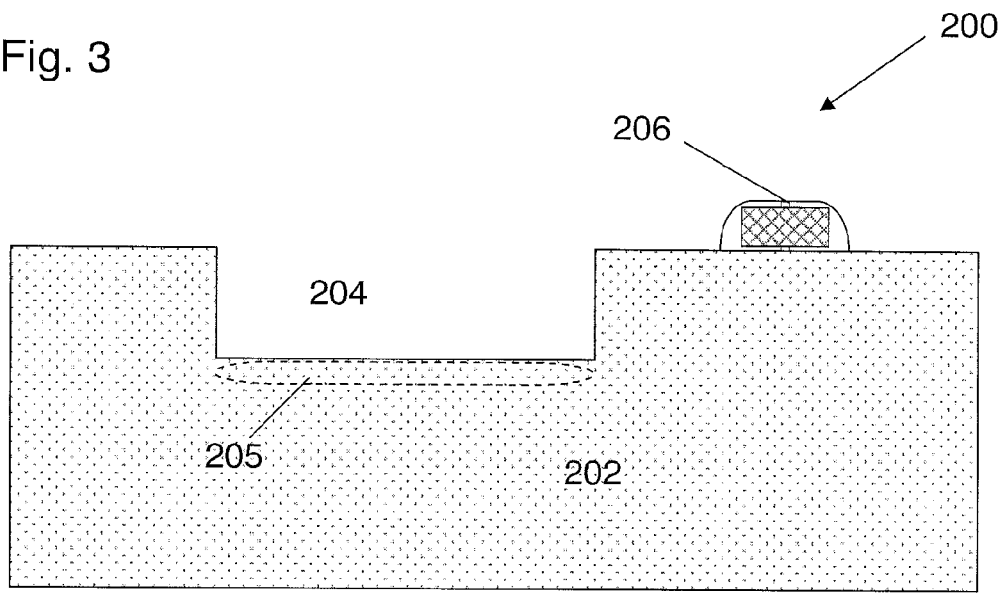
FIG. 3 is a cross-sectional view of a wafer with a pit.

Referring to FIGS. 2 and 3, examples of fabrication processes for devices structured as shown in FIGS. 1A-1B on a wafer 200 begin with laser marking and cleaning (10) a silicon substrate 202. A pit 204 is formed (12) in a region of silicon substrate 202; the depth of pit 204 is generally between 0.2 µm and 2.0 µm. Pit 204 may be formed at any point during front-end processing of standard metal-oxide-semiconductor (MOS) transistors. In the example shown in FIG. 3, a representative transistor 206 was fabricated prior to the formation of pit 204. In other embodiments, pit 204 is formed prior to the fabrication of front-end integrated circuit components, such as MOS transistors. In general, pit 204 is formed before the fabrication of any back-end integrated circuit components.

Figure 4A:
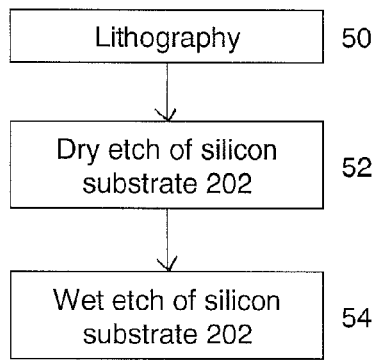
FIGS. 4A-4D are flow diagrams of fabrication processes for a pit in a wafer.
Figure 4B:
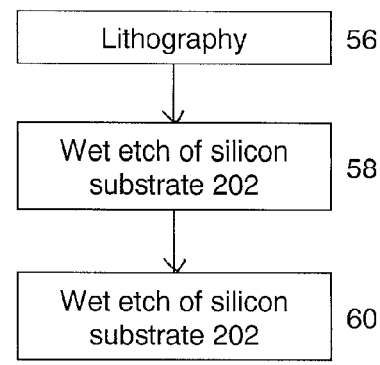

Pit 204 can be formed using a variety of methods. Referring to FIG. 4A, in some examples, silicon substrate 202 is masked and a lithography process is performed (50) to define a location for the formation of pit 204. Pit 204 is formed by a dry chemical etch (52) of silicon substrate 202 followed by a wet chemical etch (54) to smooth the etched surface of the silicon substrate. Alternatively, as shown in FIG. 4B, a lithography process defines (56) a location for the formation of pit 204. A first wet chemical etch (58) of silicon substrate 202 is followed by a second wet chemical etch (60) to smooth the surface of the substrate to form pit 204. In general, the location of pit 204 is defined by a mask.

Figure 4C:
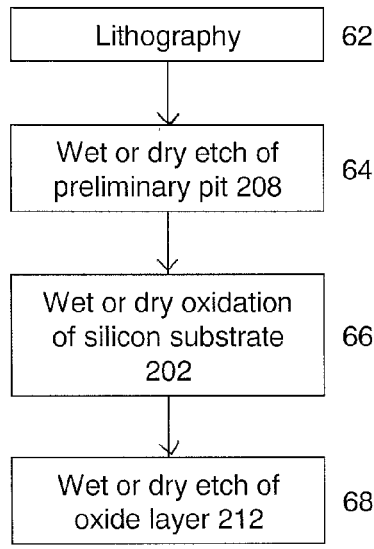
Figure 5A:
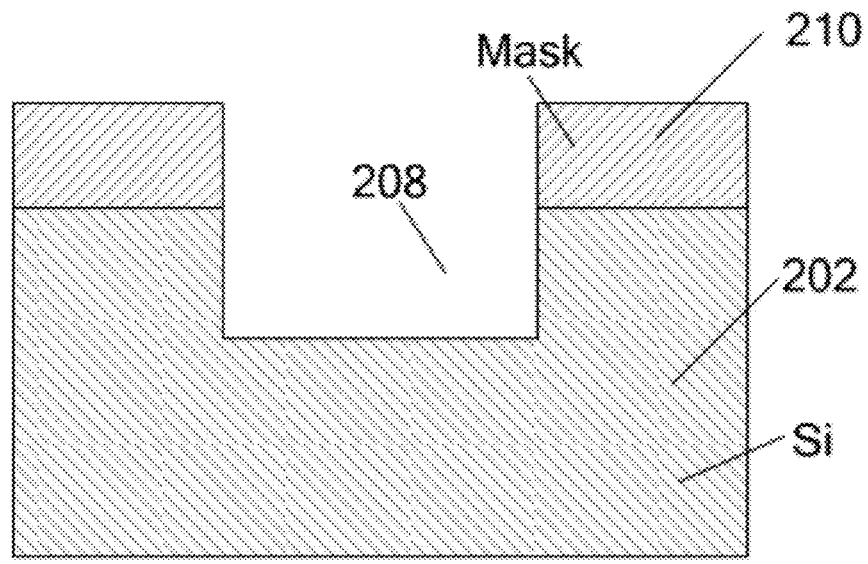
FIGS. 5A-5C are cross-sectional views of a method for generating a pit in a wafer.
Figure 5B:
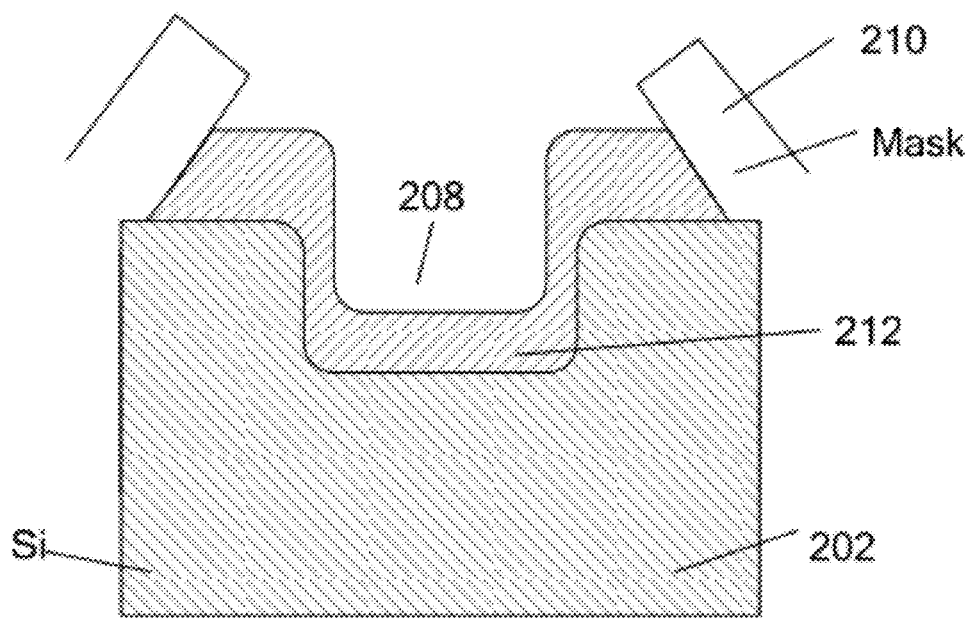
Figure 5C:
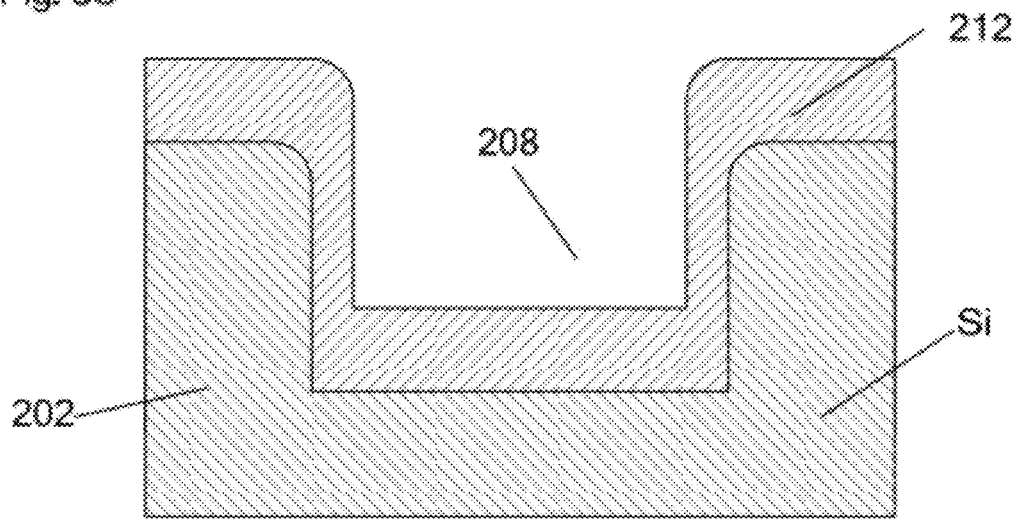

Referring to FIGS. 4C and 5A, another method to fabricate pit 204 involves a lithography process (62) to pattern a mask 210 defining a position for a preliminary pit 208. Mask 210 is typically a hard mask such as silicon nitride ($Si_xN_y$), silicon oxynitride ($SiO_xN_y$), silicon oxide ($SiO_x$), or another material having suitable properties. Preliminary pit 208 is etched (64) into silicon substrate 202 via a wet etch or a dry etch. After etching preliminary pit 208, the surface of silicon substrate 202 is oxidized (66) using either dry oxidation or wet oxidation to smooth the etched surface of preliminary pit 208 and/or to deepen preliminary pit 208. Oxidation can be performed with mask 210 still present, as shown in FIG. 5B, or after the removal of mask 210, as shown in FIG. 5C. The oxidation process generates an oxide layer 212. Pit 204 is then formed by a wet etch or dry etch (68) of oxide layer 212 within preliminary pit 208.

Figure 4D:
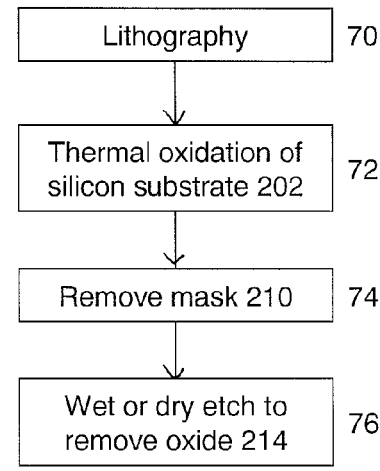
Figure 6A:
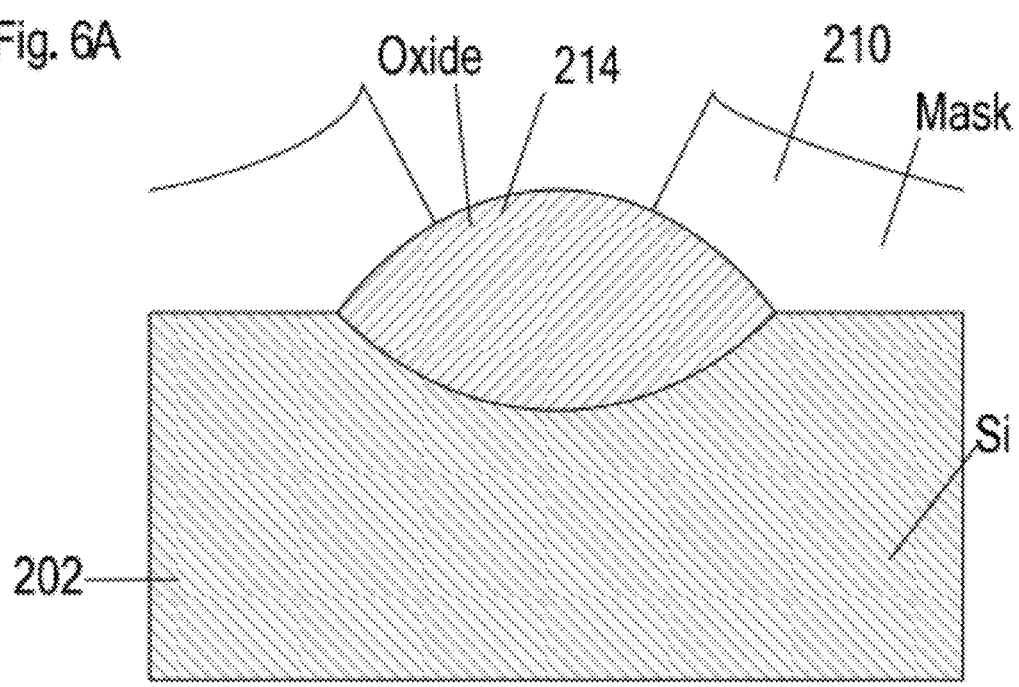
FIGS. 6A-6B are cross-sectional views of a method for generating a pit in a wafer.
Figure 6B:
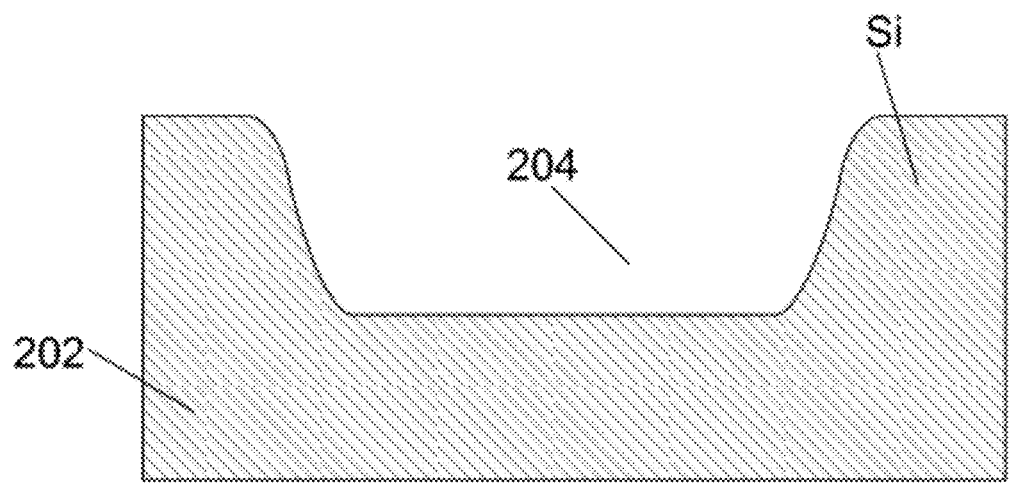

Referring to FIGS. 4D and 6A, a further alternative to forming pit 204 involves a lithography process (70) to pattern mask 210, defining a position for pit 204. The top surface of silicon substrate 202 is thermally oxidized (72) to form an oxide 214 in the regions of the surface not protected by mask 210. Mask 210 is then removed (74) and pit 204 is revealed by removal of oxide 214 via wet etching or dry etching (76), as shown in FIG. 6B. To obtain the desired pit depth, multiple patterning, oxidation, and removal steps may be performed.

Referring again to FIGS. 2 and 3, after pit 204 is formed, an implantation process (14) is performed to adjust the doping concentration in a region 205 at the base and/or in the sidewalls of pit 204. Ultimately, a photodetector body will be grown in pit 204. Adjusting the doping concentration in region 205 reduces the contact and/or series resistance between the photodetector body and silicon substrate 202.

Figure 7:
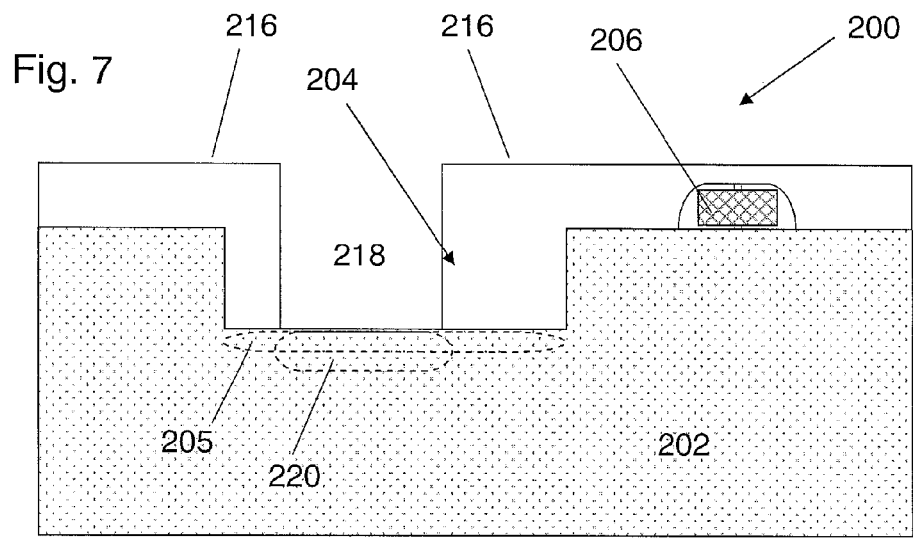
FIG. 7 is a cross-sectional view of the wafer of FIG. 2 with a deposited insulating layer.

Continuing to refer to FIGS. 2 and 7, after the formation of pit 204 and the implantation of the pit region, an insulating layer 216 is grown or deposited (16) over the surface of silicon substrate 202. Insulating layer 216 is typically silicon dioxide ($SiO_2$), but may be composed of silicon oxide ($SiO_x$), silicon nitride ($Si_xN_y$), silicon oxynitride ($SiO_xN_y$), or another material having similar properties. Multiple layers of these materials may be formed. The top surface of insulating layer 216 is higher than the top surface of transistor 206. A chemical mechanical polish (CMP) step is optionally performed (20) to flatten the surface of insulating layer 216. Alternatively, in the embodiment shown in FIG. 6A, oxide layer 212 is not removed (18) after the thermal oxidation step, and a CMP step is performed (20) after mask removal to planarize oxide layer 212.

Referring again to FIGS. 2 and 7, a hole 218 is generated (22) in insulating layer 216 by a wet etch or dry etch process, or a combination of both wet etch and dry etch processes. Hole 218 is aligned with pit 204 and is deep enough such that a portion of silicon substrate 202 is exposed at the base of hole 218. In some embodiments, an implantation process is performed (24) to adjust the doping concentration in a region 220 at the base of hole 218. As with the doping of region 205, adjusting the doping concentration in region 220 reduces the contact and/or series resistance between the photodetector body and silicon substrate 202.

Figure 8:
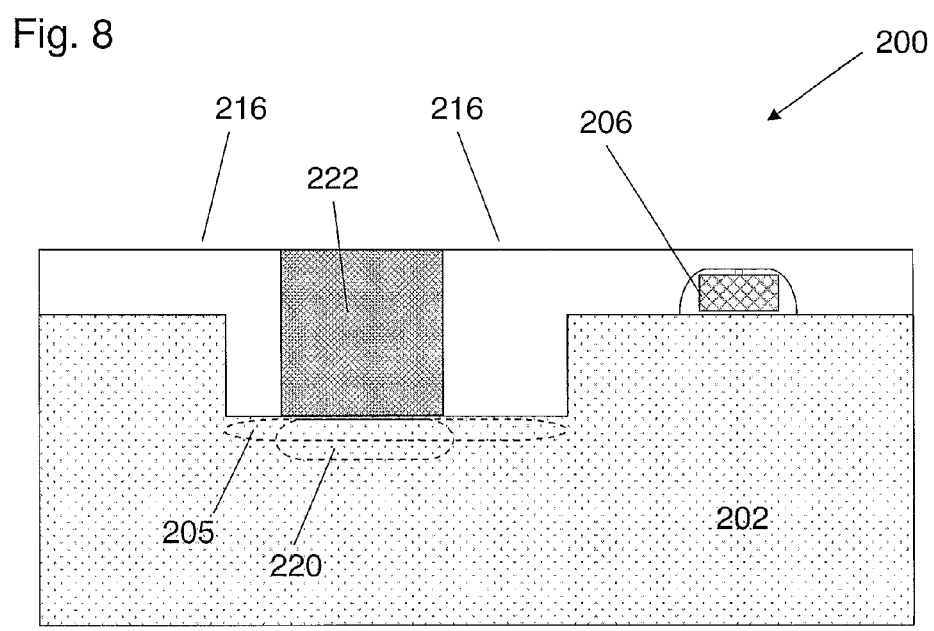
FIG. 8 is a cross-sectional view of the wafer of FIG. 5 with a photodetector body grown in the pit.

Referring to FIGS. 2 and 8, selective growth of germanium (Ge) or silicon germanium (SiGe) within hole 218 to form a photodetector body 222 is performed (26) by a chemical vapor deposition (CVD) process, such as ultra-high vacuum CVD (UHCVD) or low pressure CVD (LPCVD). Photodetector body 222 may be grown by epitaxial growth of Ge or SiGe on substrate 202. Since Ge and SiGe does not grow on insulating layer 216, growth is limited to the exposed region of substrate 202 at the base of hole 218. In some embodiments, after the growth of photodetector body 222, wafer 200 is thermally annealed (28) at a defined temperature range between 700° C. and 900° C. During the CVD growth process, photodetector body 222 may have grown higher than a top surface 224 of insulating layer 216. In this case, a CMP process is optionally performed (30) to remove the overgrown portion of photodetector body 222, resulting in a planar top surface of wafer 200.

Figure 9:
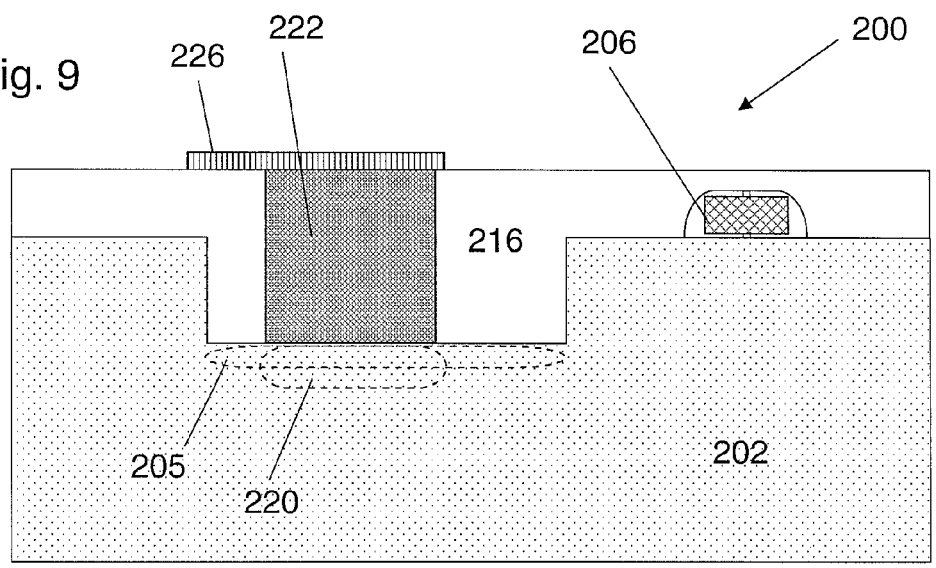
FIG. 9 is a cross-sectional view of the wafer of FIG. 6 with a top contact formed on the photodetector body.

Referring to FIGS. 2 and 9, in some embodiments, a contact layer of polysilicon or amorphous silicon is grown or deposited (32) and then patterned (34) to form a top contact 226 to photodetector body 222.

Figure 10:
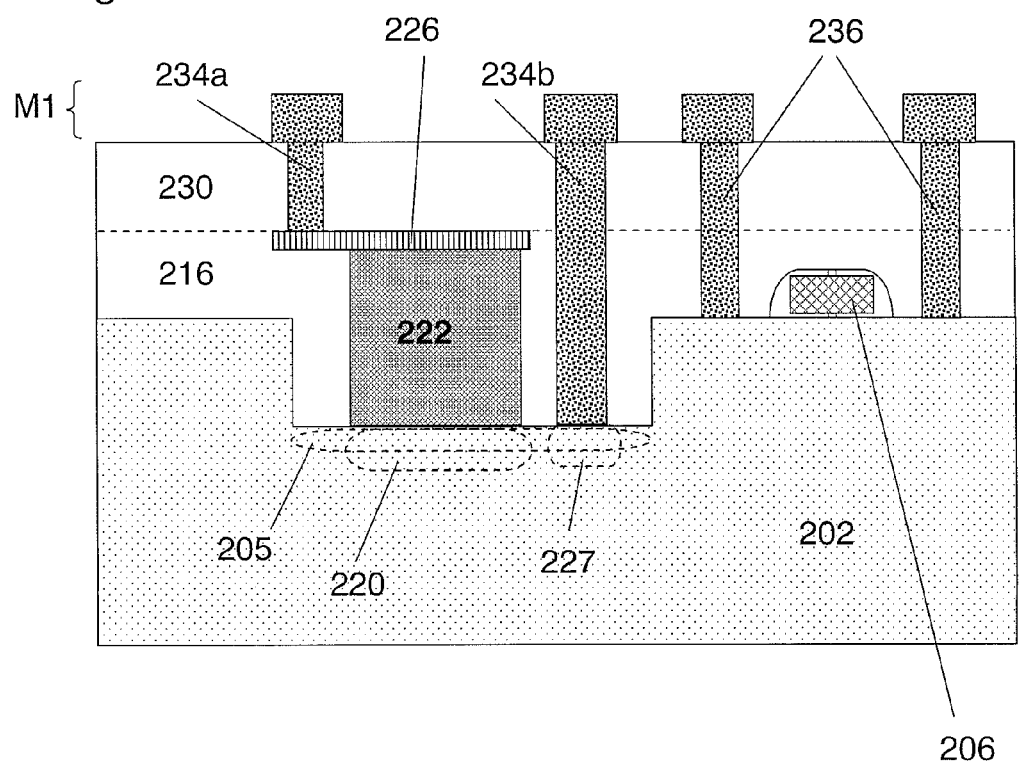
FIG. 10 is a cross-sectional view of the wafer of FIG. 7 with initial back-end structures fabricated.

Referring to FIGS. 2 and 10, a dielectric layer 230 is deposited (36) on top of existing insulating layer 216 and top contact 226 to raise the top surface of wafer 200 to a level sufficient for further processing, such as for the formation of interconnects and a first metallization layer M1. Metal plugs, such as tungsten plugs, are formed (40) using standard CMOS processing techniques. Photodetector contact plugs 234a and 234b are used to make contact with top contact 226 and region 205 (i.e., the doped bottom contact) of photodetector body 222, respectively. Prior to the formation of photodetector contact plugs 234, an implantation in a region 227 at the base of pit 204 may be performed (38) to adjust the doping level in region 227, thus reducing the contact resistance between photodetector contact plug 234b and silicon substrate 202. In this configuration, photon induced carriers generated in photodetector body 222 are collected vertically through top contact 226 and bottom contact region 205. Transistor contact plugs 236 are formed to connect a source, drain, and gate (not shown) of transistor 206 to first metallization layer M1. The materials and processing steps for the formation of photodetector contact plugs 234 are not necessarily the same as the materials and processing steps for the formation of transistor contact plugs 236. After the formation of metal plugs 234 and 236, standard back-end processing for the wiring of metal interconnects of MOS transistors, other integrated circuit components, and photodetectors is then performed (42).

Since Ge and SiGe does not, in general, endure the high temperature thermal processing (>950° C.) used for front-end CMOS processing (i.e., transistor fabrication), the growth of photodetector body 222 and the optional thermal anneal step are preferably performed after the finish of high temperature front-end processing of transistor 206. For example, photodetector body 222 is grown after the formation of the polysilicon gate of transistor 206. The growth and anneal of Ge or SiGe photodetector body 222 involves processing at relatively high temperatures (between approximately 600° C. and 900° C.). All low-temperature back-end processing (i.e., fabrication of metal interconnects) is preferably performed after photodetector body 222 is grown and annealed.

Figure 11:
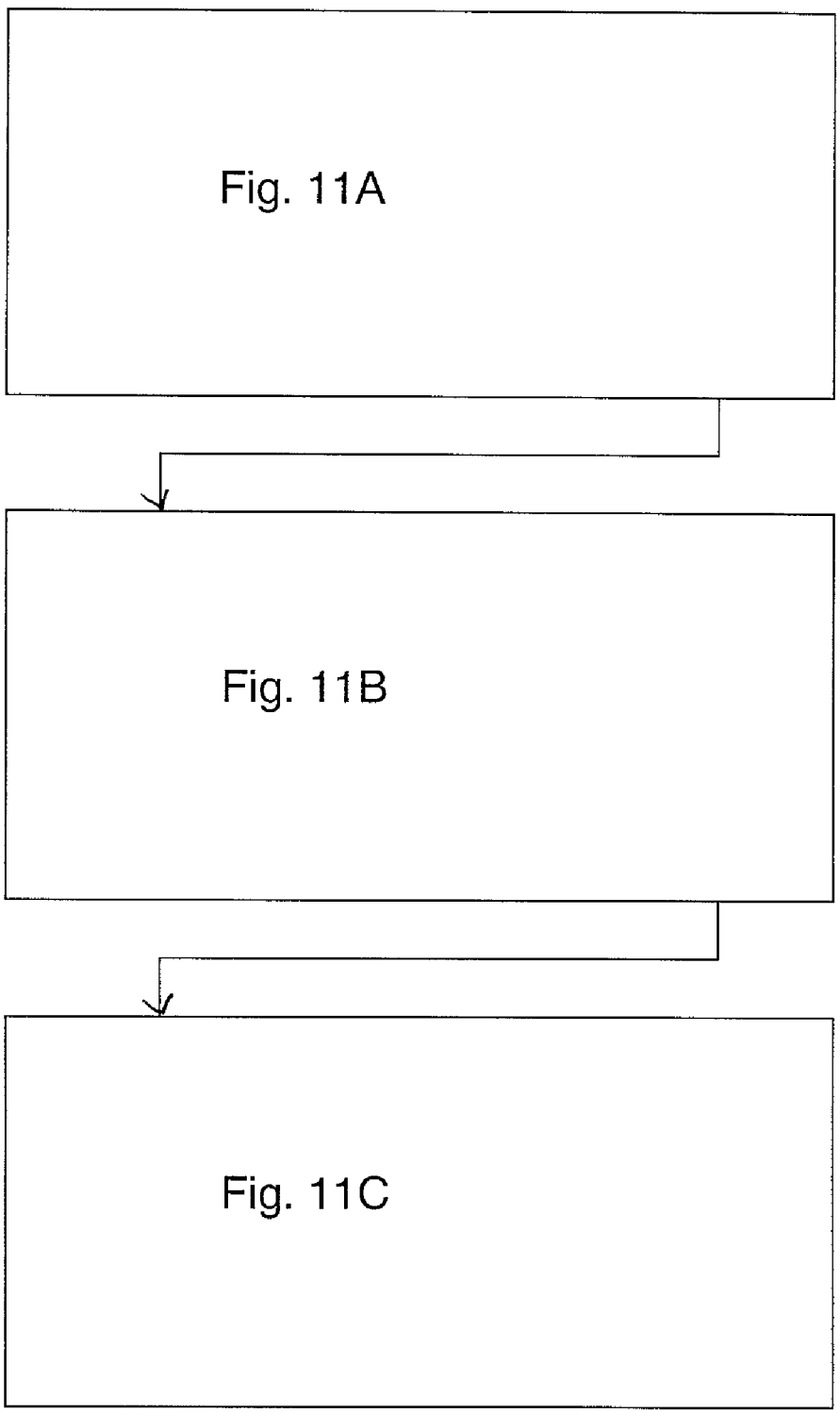
FIG. 11 is a flow diagram of one example of a fabrication process.
Figure 11A:
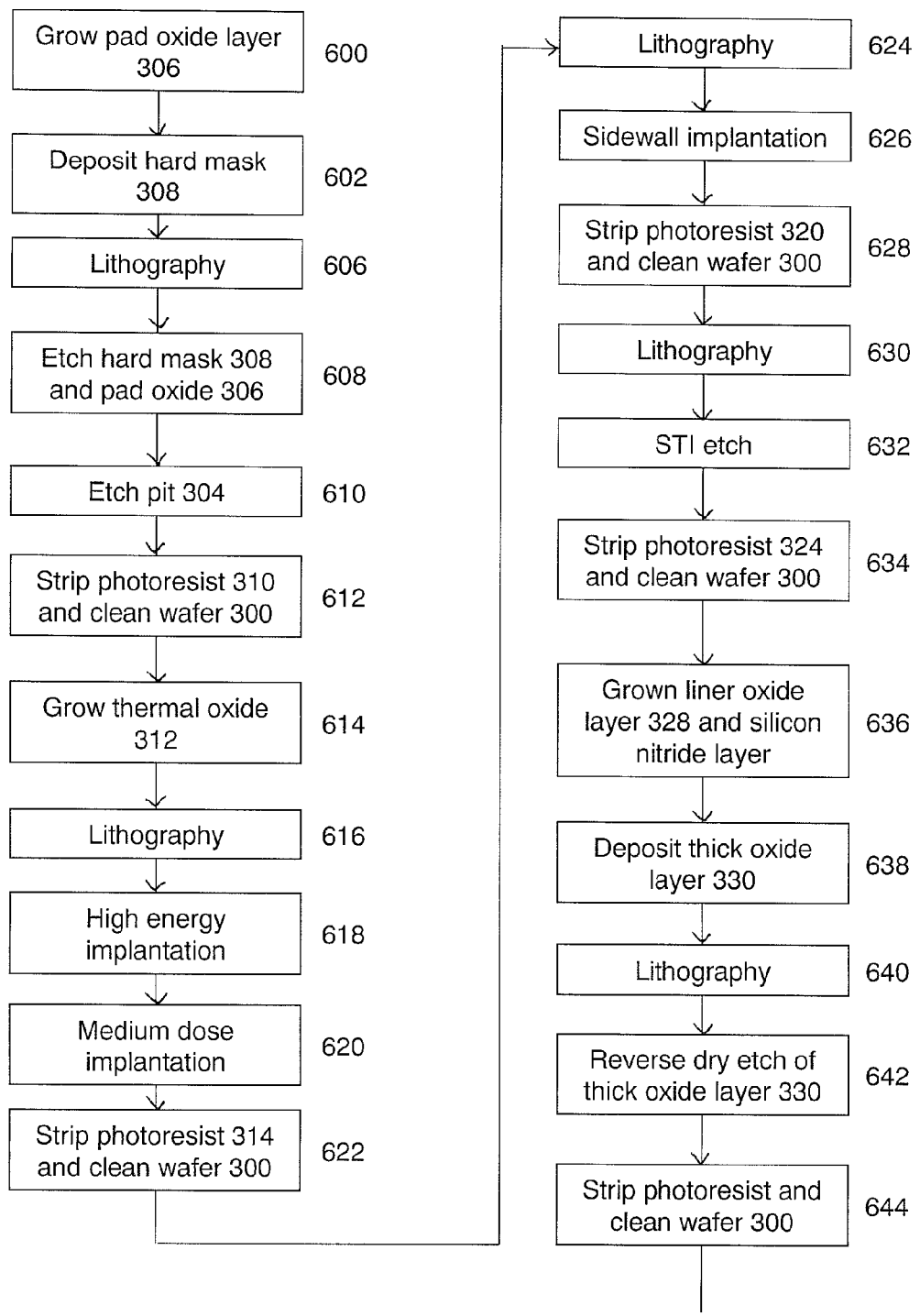
Figure 11B:
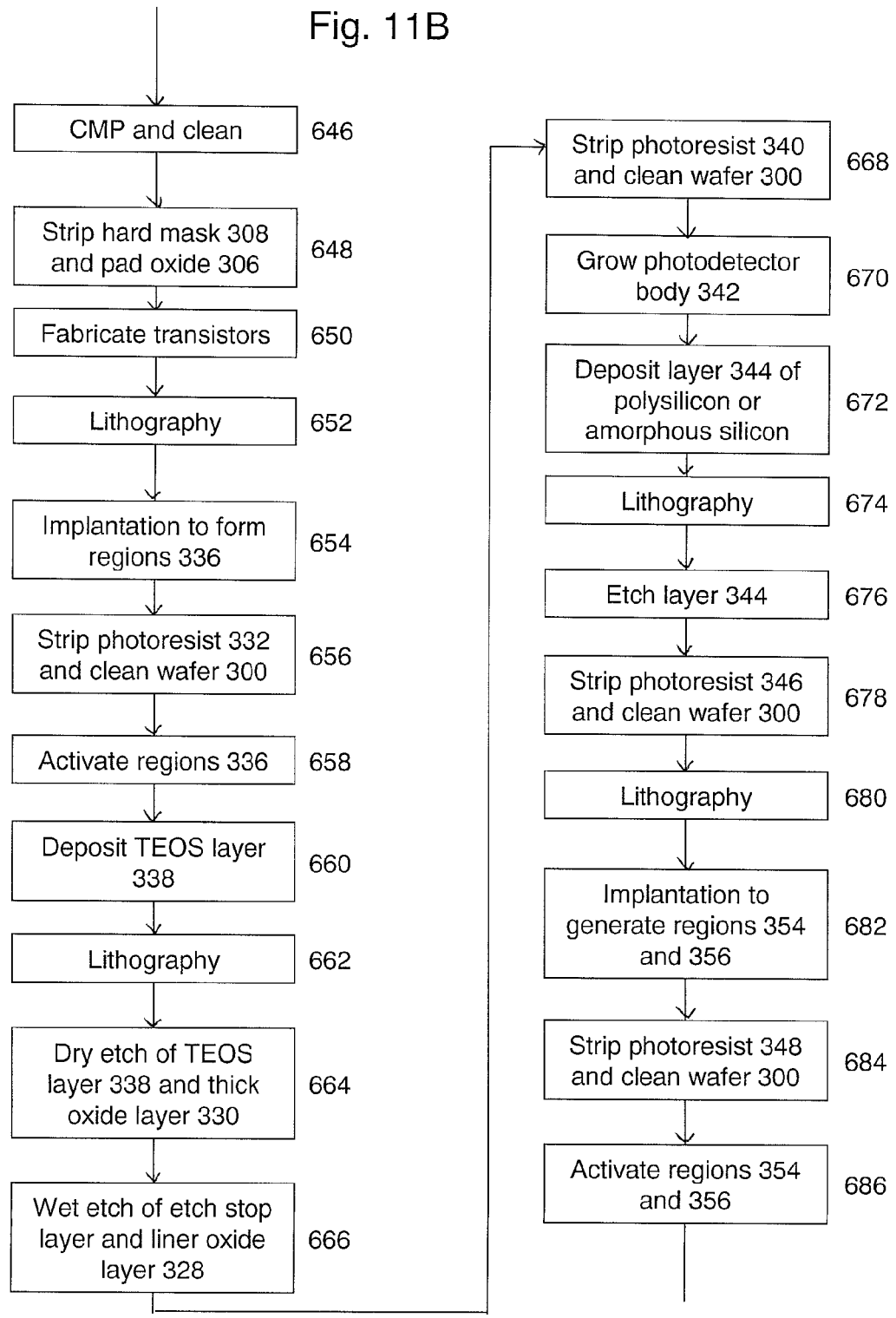
Figure 12:
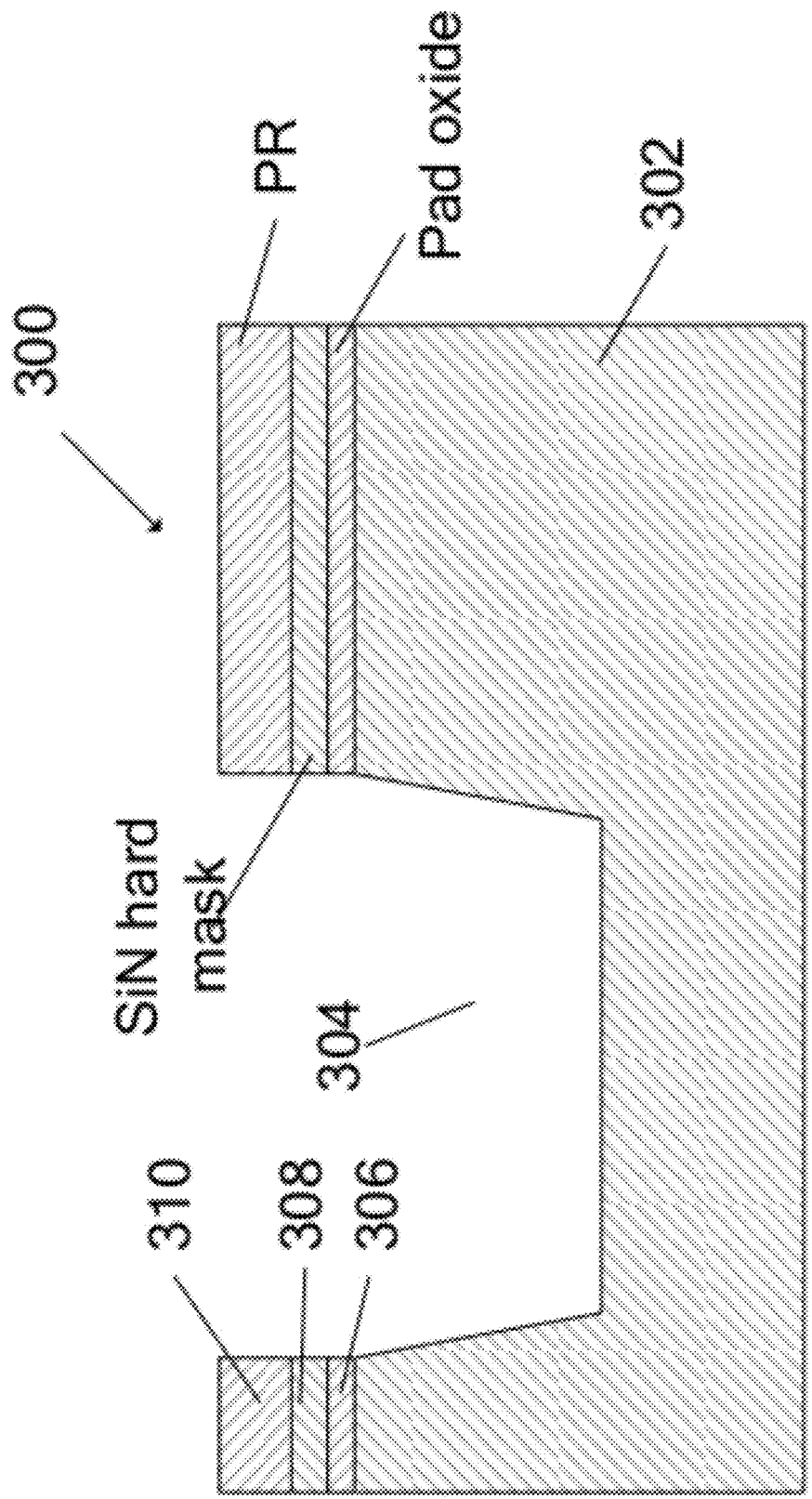
FIG. 12 is a cross-sectional view of one embodiment of a method for generating a pit in a wafer.

Referring to FIGS. 11 and 12, in a specific embodiment, a wafer 300 on which a photodetector is fabricated includes a silicon substrate 302. A pad oxide layer 306 is grown (600) on the top surface of silicon substrate 302 and a hard mask 308 of silicon nitride is deposited (602). A photoresist layer 310 is deposited on top of hard mask 308 and a lithography process is performed (606) to define a region for the formation of a pit 304. To generate pit 304, hard mask 308 and pad oxide 306 are removed by an etch process (608), and pit 304 is etched (610) into silicon substrate 302 to a depth of between 0.2 μm and 2.0 μm. Photoresist layer 310 is stripped and wafer 300 is cleaned (612).

Figure 13A:
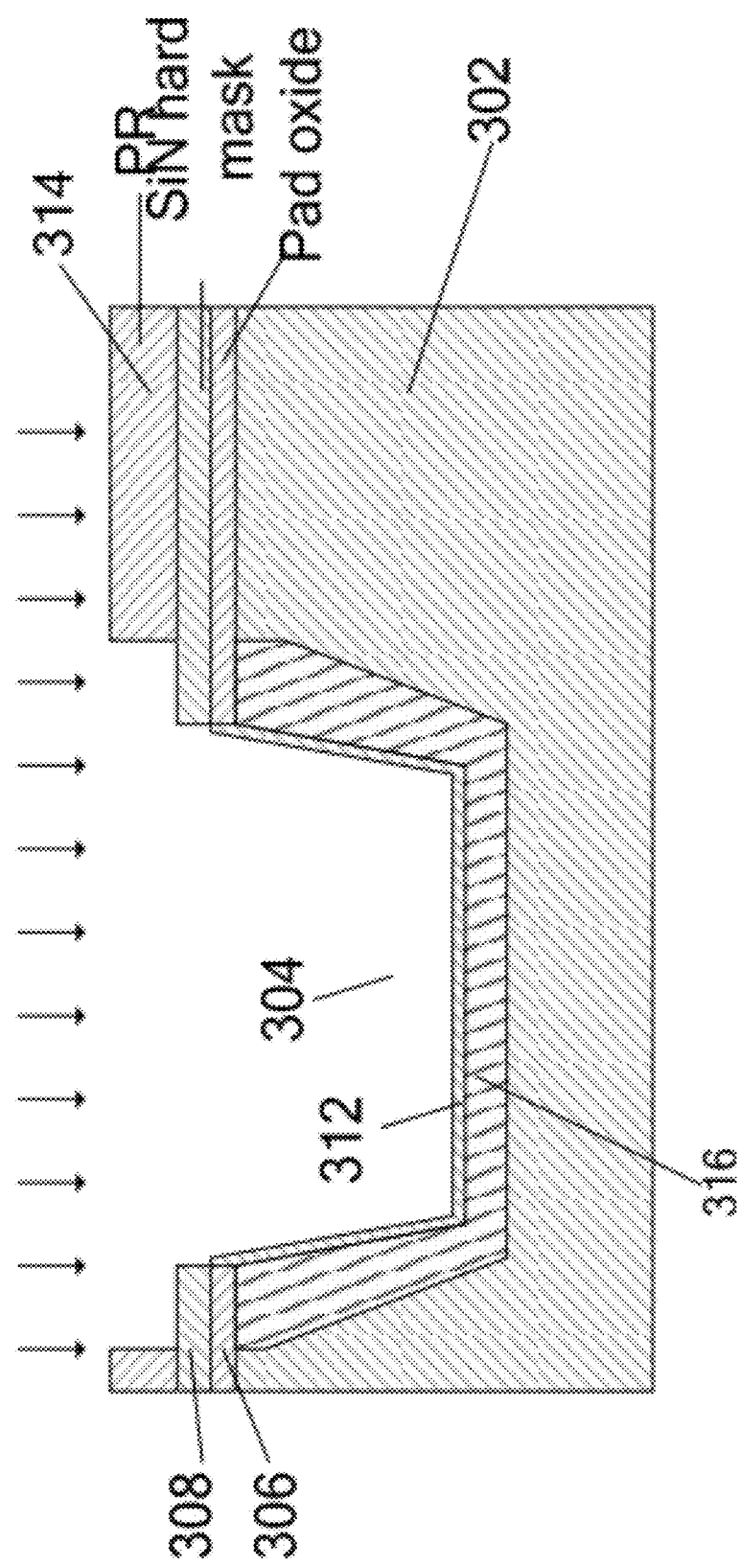
FIGS. 13A-13B are cross-sectional views of an implantation into the wafer of FIG. 9.
Figure 13B:
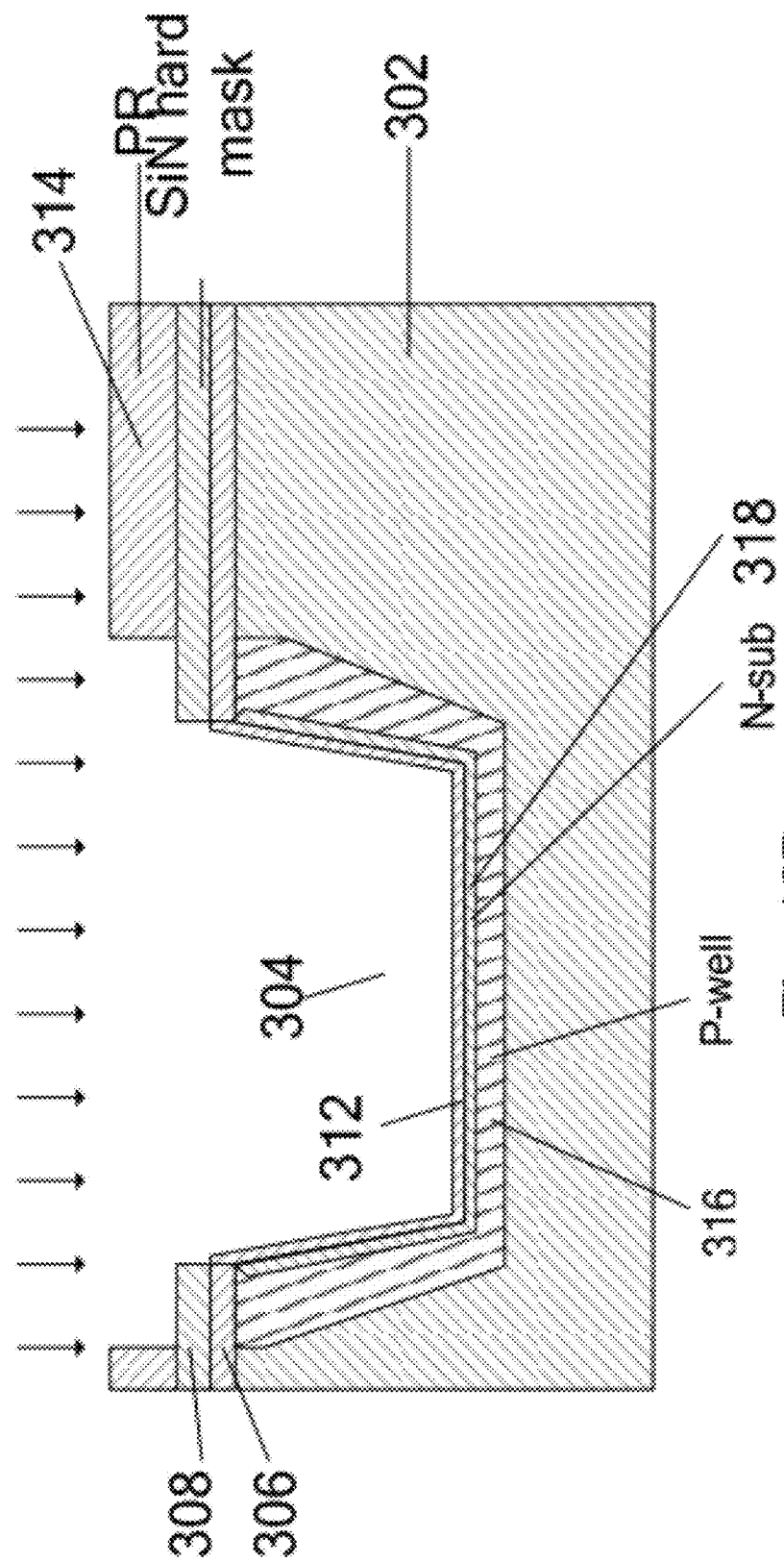

Referring to FIGS. 11 and 13A, a thermal oxide 312 is grown (614) within pit 304 to repair the base of pit 304. Implantation processes are then performed to dope the base and sidewalls of pit 304. A photoresist layer 314 is deposited on top of hard mask 308 and a lithography process is performed (616) to define a region for the implantation. For a p-side-down photodetector, a first high energy implantation (618) of Boron generates a p-well 316 within pit 304. A subsequent medium dose implantation (620) of Arsenic or Phosphorus generates an n-sub 318 within p-well 316, as shown in FIG. 13B. Alternatively, if an n-side-down photodetector is desired, high energy implantation of Arsenic or Phosphorus forms an n-well, and medium dose implantation of Boron is used to generate a p-sub. Following implantation, photoresist layer 314 is stripped and wafer 300 is cleaned (622).

Figure 14:
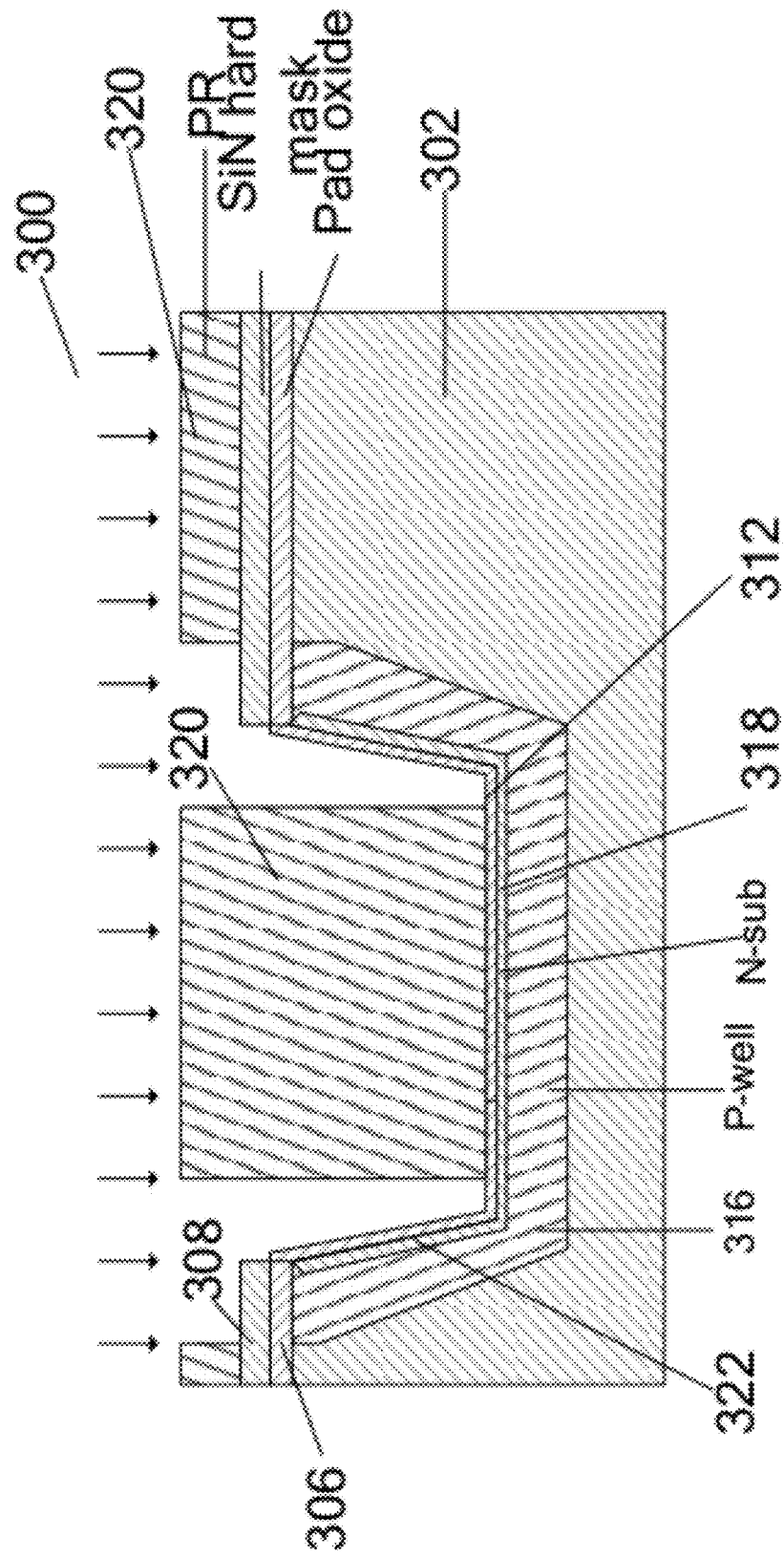
FIG. 14 is a cross-sectional view of a second implantation step into the wafer of FIG. 10.

Referring to FIGS. 11 and 14, a further implantation process is performed to dope the sidewalls of pit 304. A photoresist layer 320 is deposited and a lithography process (624) defines a region for the implantation. A high dose implantation (626) of Phosphorus or Arsenic generates an n+ conductive region 322 (for a p-side-down photodetector). Alternatively, for an n-side-down photodetector, an implantation of Boron generates a p+ conductive region. Photoresist layer 320 and thermal oxide 312 on the bottom and sides of pit 304 are stripped and wafer 300 is cleaned (628).

Figure 15:
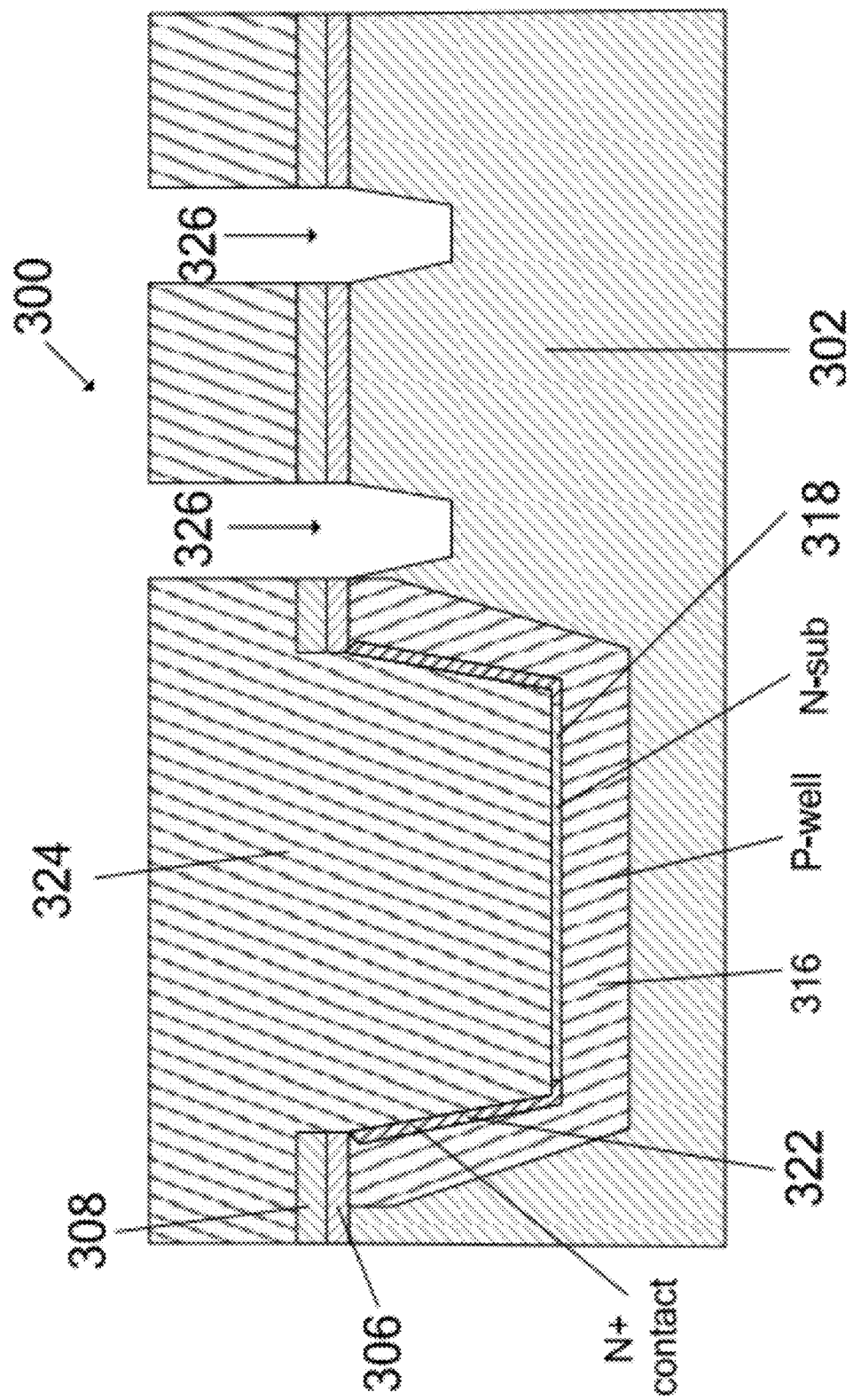
FIG. 15 is a cross-sectional view of a shallow trench isolation (STI) etch step in the wafer of FIG. 11.
Figure 16:
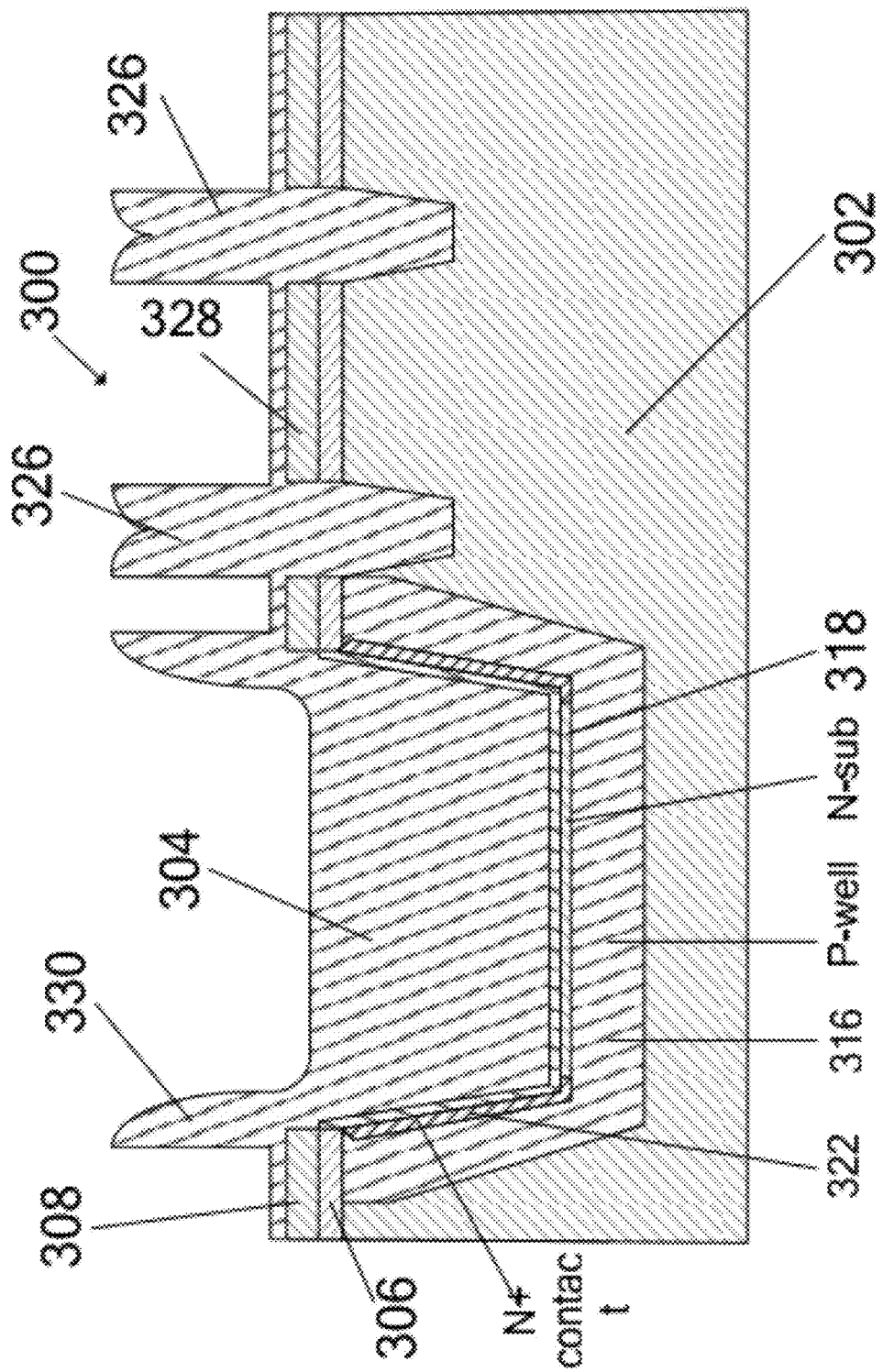
FIG. 16 is a cross-sectional view of the wafer of FIG. 12 with a deposited thick oxide layer.

In this embodiment, front-end fabrication of transistors is started after the formation and doping of pit 302. Referring to FIGS. 11 and 15, a photoresist layer 324 is deposited and lithography is performed to define regions 326 for a shallow trench isolation (STI) etch. Hard mask 308, pad oxide 306, and silicon substrate 302 are etched (632) in regions 326. Photoresist layer 324 is stripped and wafer 300 is cleaned (634). Referring to FIG. 16, a liner oxide layer 328 and a silicon nitride etch stop layer (not shown) are grown (636) over the top surface of wafer 300. A thick oxide layer 330 is deposited (638) using a high density plasma (HDP) deposition process or other deposition process. The thickness of thick oxide layer 330 is greater than the depth of pit 304. Another layer of photoresist (not shown) is deposited and lithography is performed (640) to enable a reverse dry etch (642) of thick oxide layer 330. The reverse etch process leaves thick oxide layer 330 only above pit 304 and in regions 326 to facilitate a subsequent CMP process. The photoresist layer is stripped and wafer 300 is cleaned (644). A CMP process and a clean are then performed (646) to flatten the surface of wafer 300. Hard mask 308 and pad oxide 306 are stripped (648). At this point, CMOS transistors may be fabricated (650) following standard CMOS procedures until reaching the n-MOS (or p-MOS) source/drain (S/D) implant steps.

Figure 17:
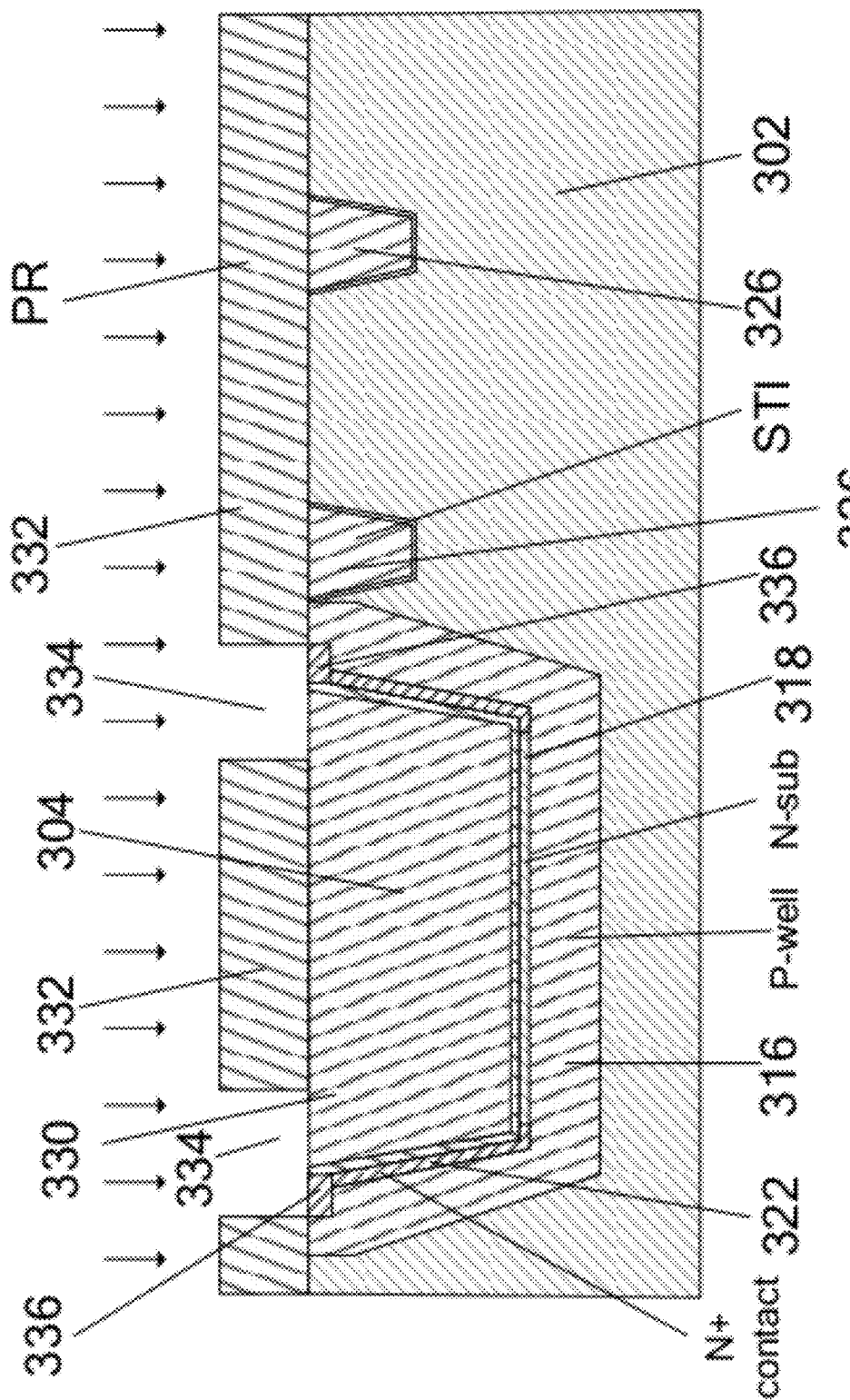
FIG. 17 is a cross-sectional view of an implantation into the wafer of FIG. 13.

Referring to FIGS. 11 and 17, once the CMOS transistors (not shown) have been fabricated, a photoresist layer 332 is deposited onto wafer 300. A lithography step is performed (652) to open regions 334 in locations suitable for generating a bottom contact for the photodetector. A high dose n+ (or p+, depending on the electrode orientation of the photodetector) S/D implant is performed (654) under conditions identical to those for a standard CMOS S/D implant process, forming n+ (or p+) regions 336. Photoresist layer 332 is stripped, wafer 300 is cleaned (656), and n+ (or p+) regions 336 are activated (658).

Figure 18:
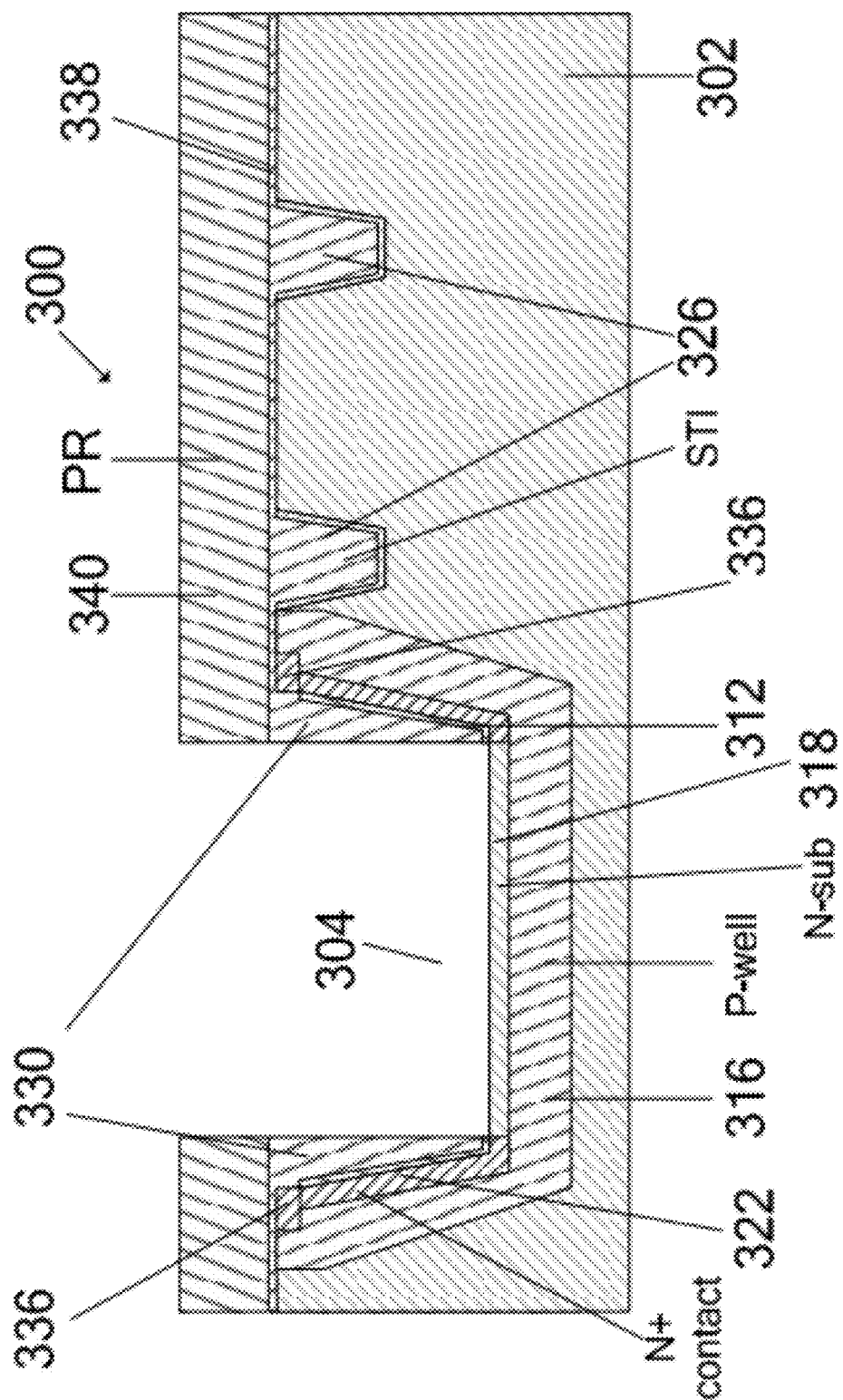
FIG. 18 is a cross-sectional view of a processing step for the wafer of FIG. 14.
Figure 19:
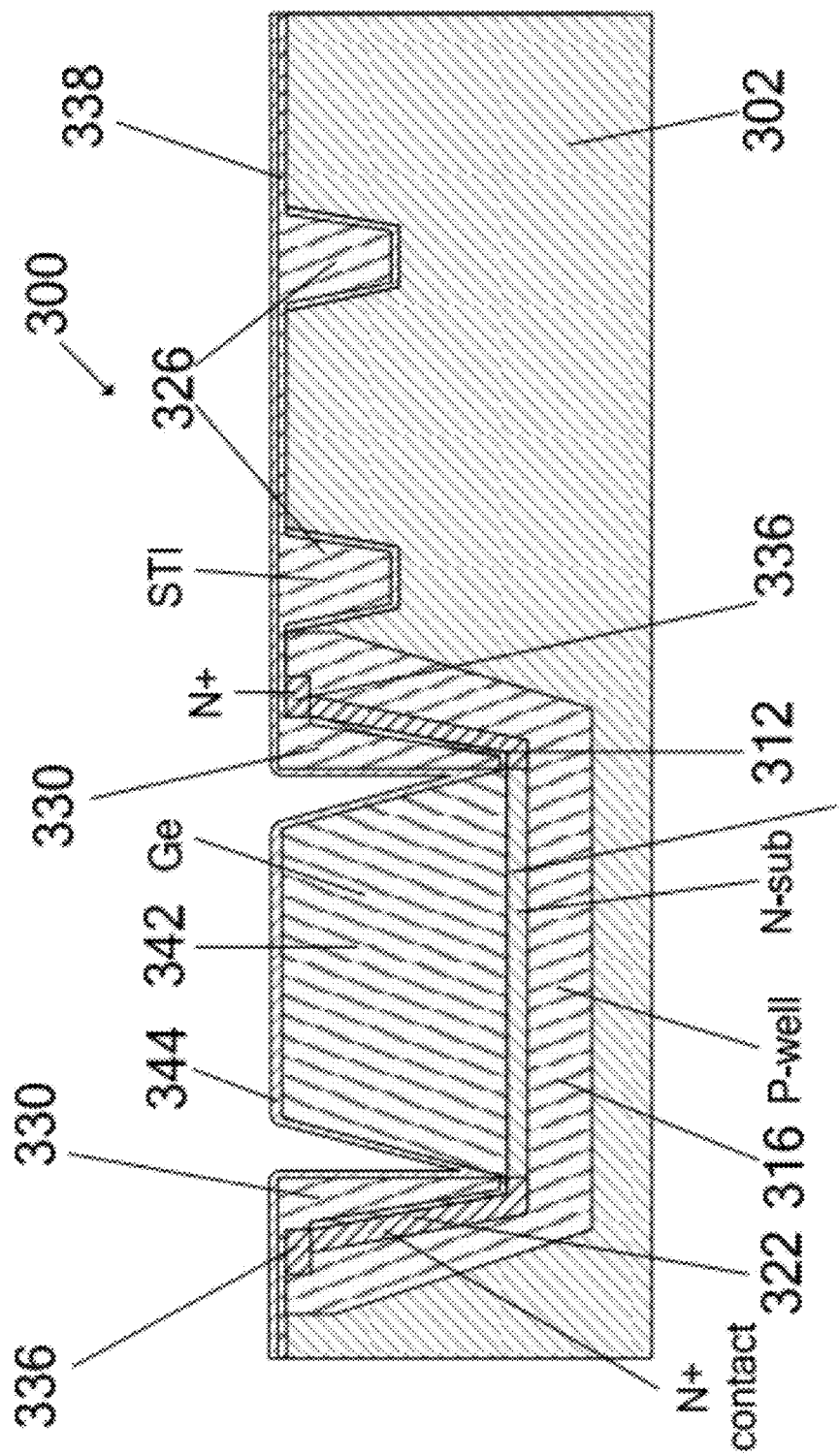
FIG. 19 is a cross-sectional view of the wafer of FIG. 15 with a photodetector body grown in the pit.

Referring to FIGS. 11 and 18, a layer of tetraethylorthosilicate (TEOS) oxide 338 is then deposited (660) to isolate transistors when integrating the photodetector with a CMOS integrated circuit. To form the photodetector, another photoresist layer 340 is deposited and lithography is performed (662) to open the photoresist in a region above pit 304. TEOS layer 338 and the portion of thick oxide layer 330 inside pit 304 are dry etched (664). Silicon nitride etch stop layer and liner oxide layer 328 at the base of pit 304 are wet etched (666). Photoresist layer 340 is stripped and wafer 300 is cleaned (668). Referring to FIG. 19, a germanium photodetector body 342 is selectively grown (670) within the etched opening in pit 304 to a thickness of between 0.5 μm to 2.5 μm. A layer 344 of polysilicon or amorphous silicon is deposited (672) on the surface of wafer 300.

Figure 20:
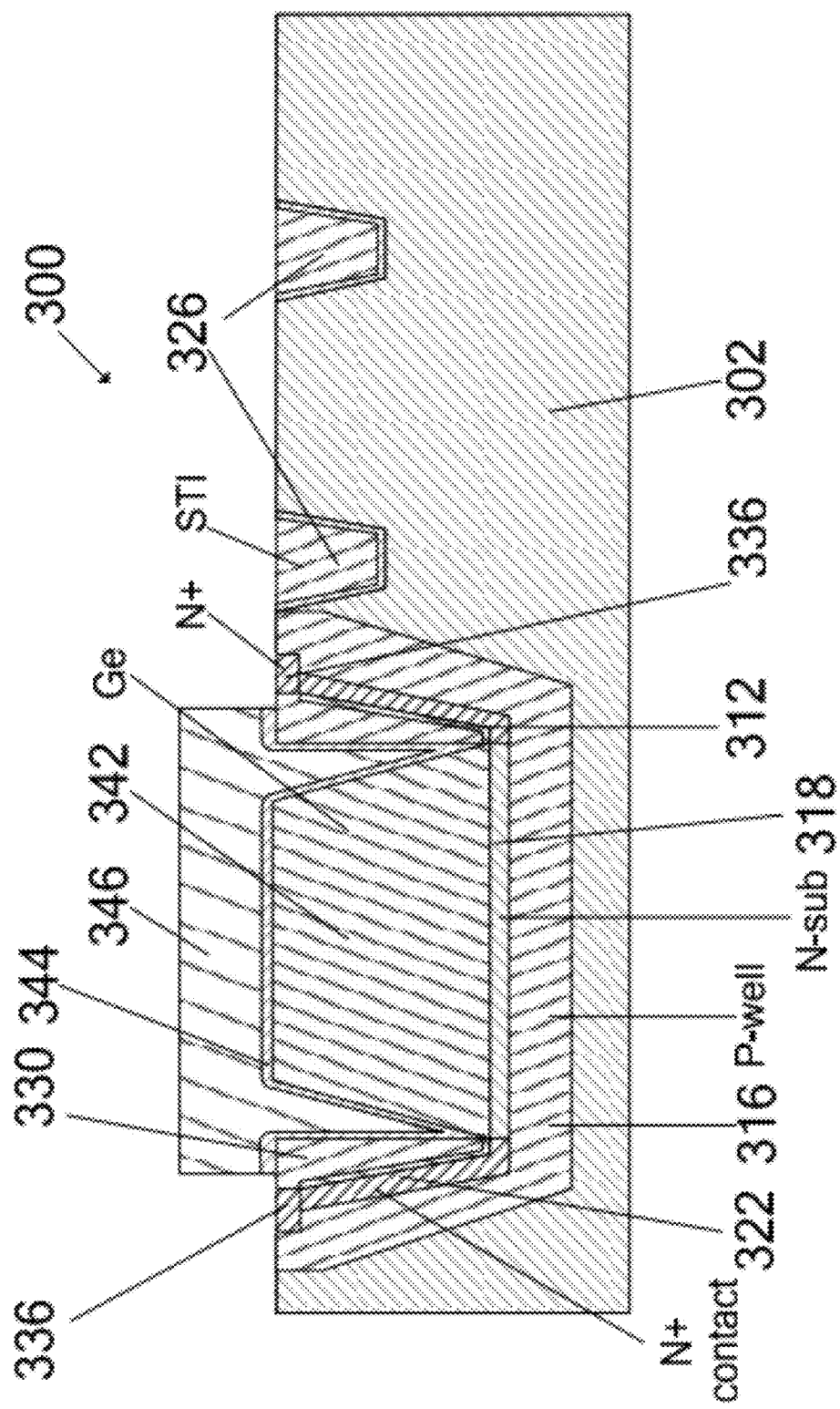
FIG. 20 is a cross-sectional view of a processing step for the wafer of FIG. 16.

Referring to FIGS. 11 and 20, a photoresist layer 346 is deposited and lithography is performed (674) such that photoresist layer 346 remains only in the region above pit 304. The layer 344 of polysilicon or amorphous silicon is etched (676) except in the region protected by photoresist layer 346. The etch process is stopped at thick oxide layer 330. Photoresist layer 346 is stripped and wafer 300 is cleaned (678).

Figure 21:
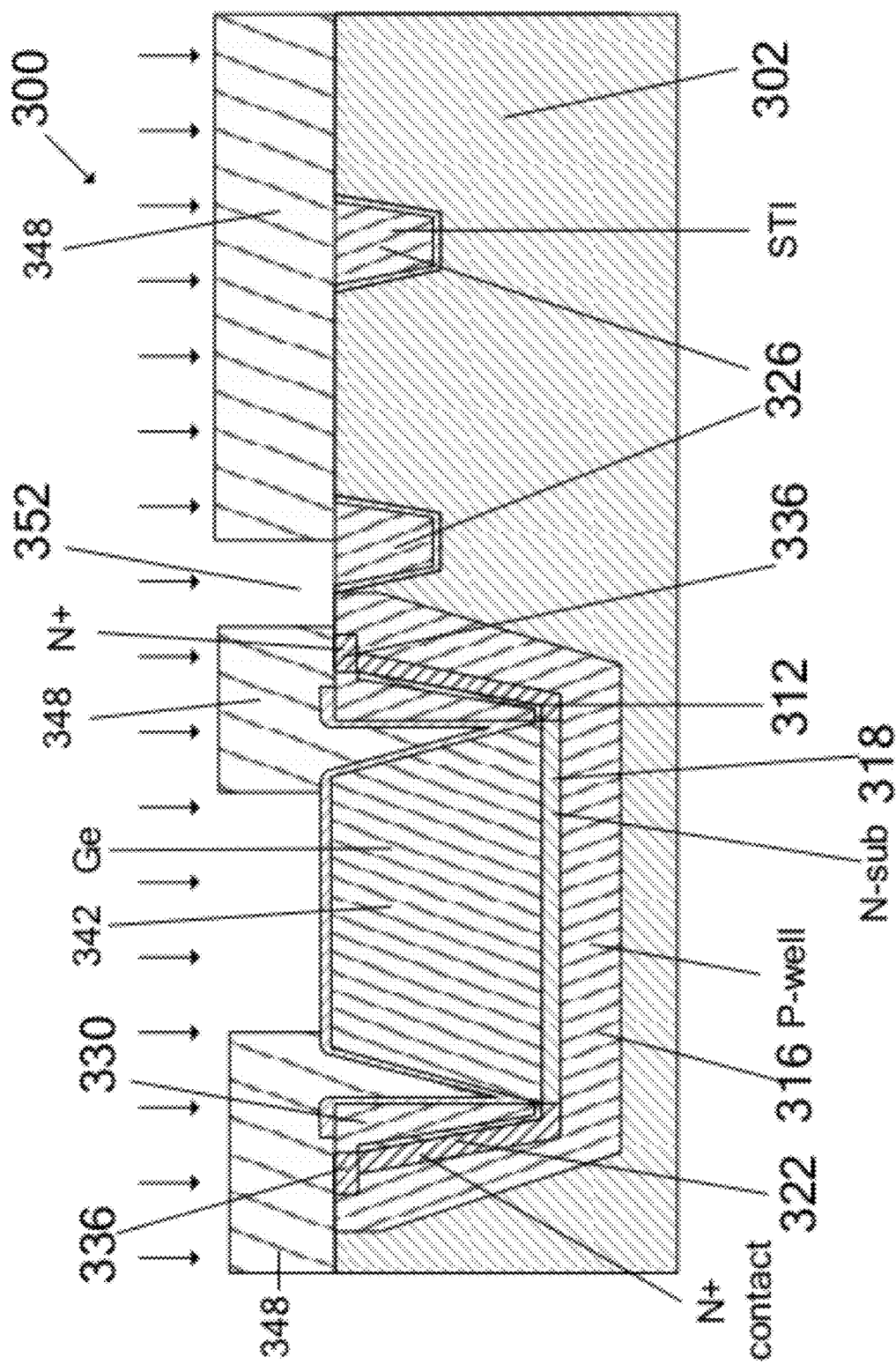
FIG. 21 is a cross-sectional view of an implantation into the wafer of FIG. 17.
Figure 22:
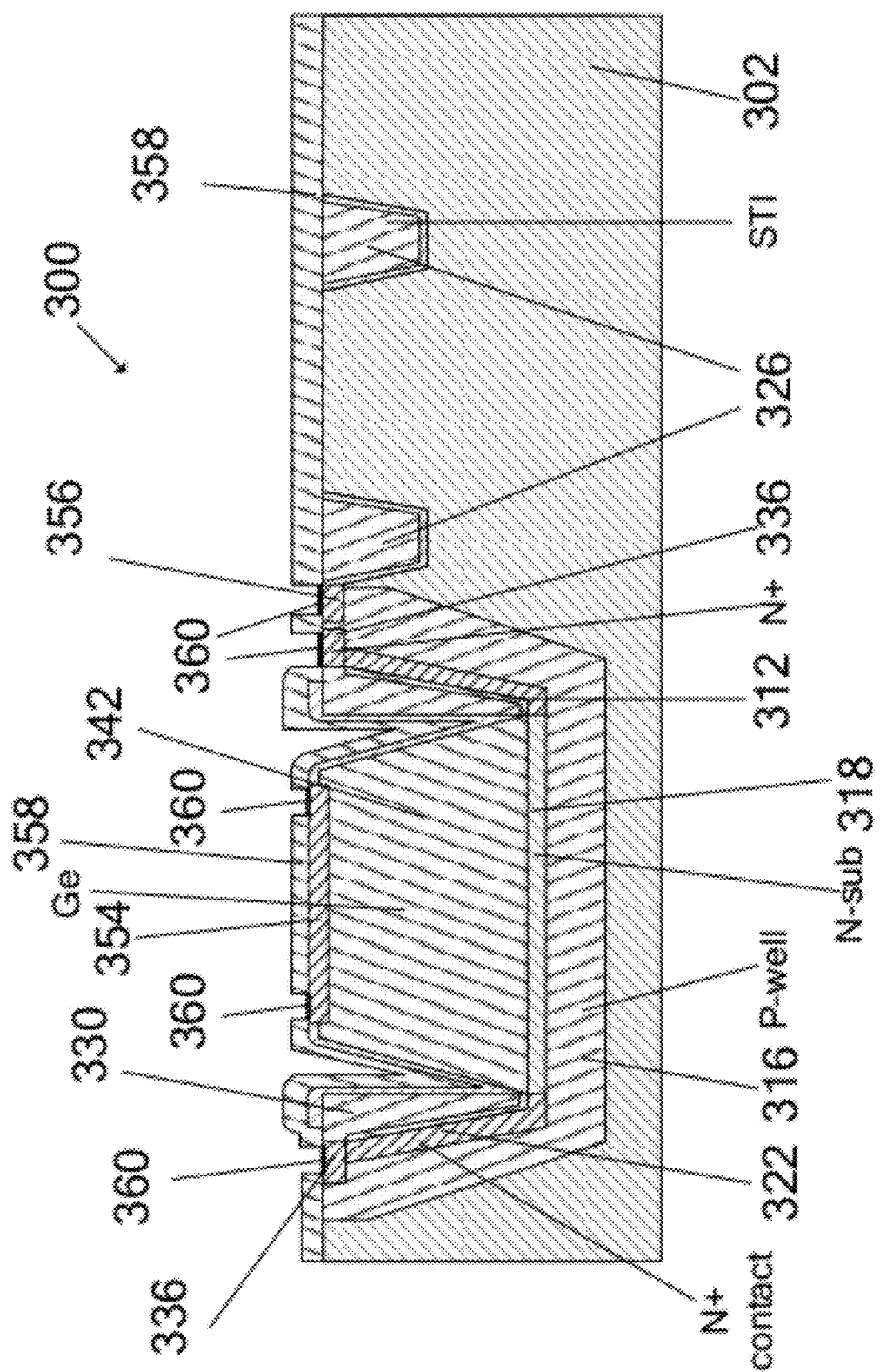
FIG. 22 is a cross-sectional view of the wafer of FIG. 18 with salicide regions.

Referring to FIGS. 11 and 21, the process to form metal plugs begins by depositing a photoresist layer 348 and performing a lithography process (680) to open desired regions 350 and 352 above photodetector body 342 and a p-well region (or n-well region), respectively. A high dose p+ implantation (682) of Boron (or an n+ implantation of Phosphorus or Arsenic) generates two p+ (or n+) regions 354 and 356, shown in FIG. 22. Photoresist layer 348 is stripped, wafer 300 is cleaned (684), and the implants in regions 354 and 356 are activated (686). A salicide blocking (SAB) layer 358 is deposited (688) over the entire top surface of wafer 300. A photoresist layer (not shown) is deposited over SAB layer 358 and a lithography process is performed (690) to define areas for etching of SAB layer 358. SAB layer 358 is etched (692) in the regions defined by the patterned photoresist, with the etch stopping at silicon substrate 302. The etch process leaves SAB layer 358 in all but regions 360. The photoresist layer is stripped and wafer 300 is cleaned (694), and regions 360 are converted to salicide (696).

Figure 23:
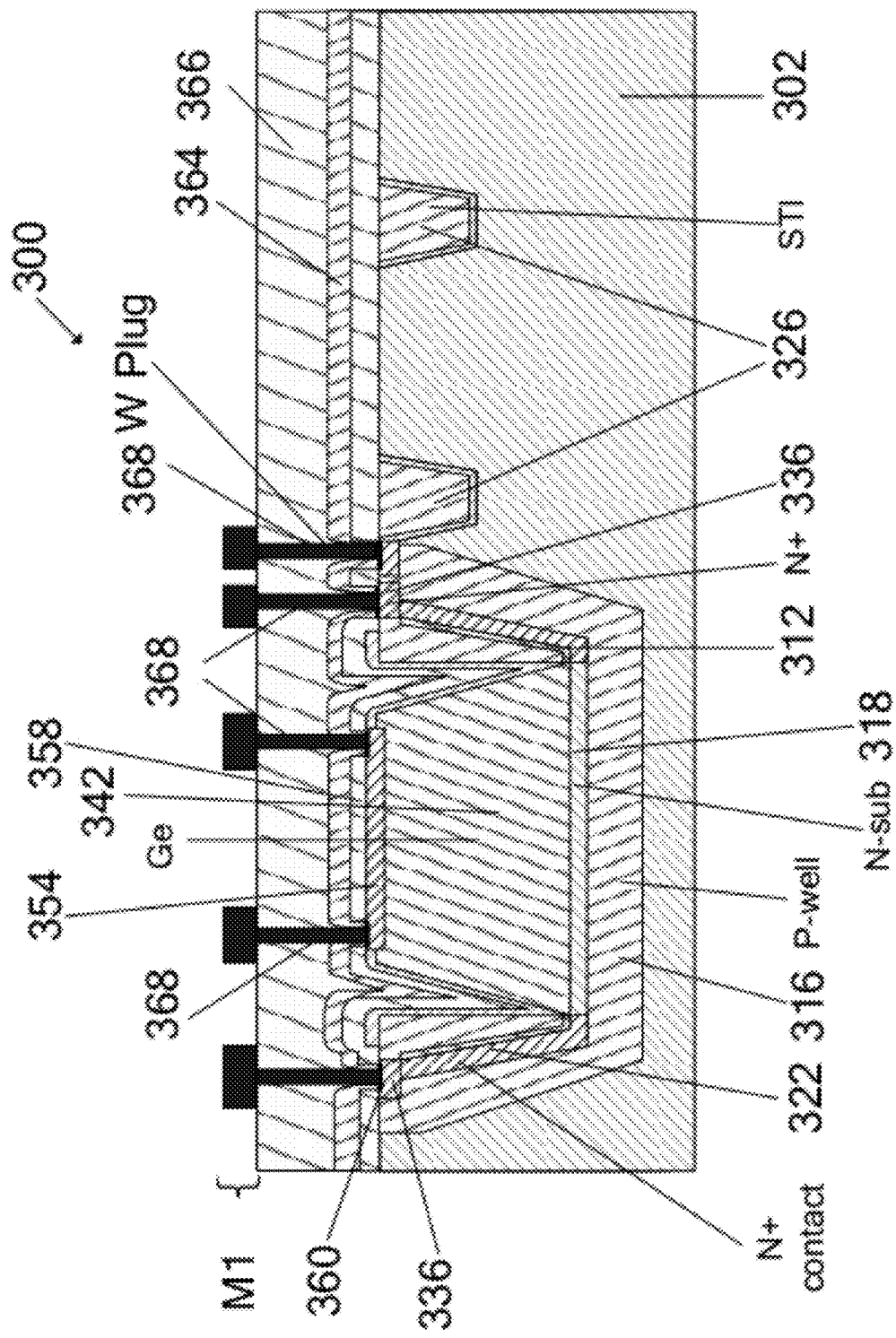
FIG. 23 is a cross-sectional view of the wafer of FIG. 19 with initial back-end structures fabricated.

Referring to FIGS. 11 and 23, a silicon nitride stop layer 364 and a thick interlayer dielectric (ILD) oxide 366 are deposited (698). ILD oxide 366 is planarized by a CMP process and wafer 300 is cleaned (700). A photoresist layer (not shown) is deposited and a lithography process (702) defines regions for metal contact plugs 368. ILD oxide 366 is etched (704) in these regions, stopping at stop layer 364; stop layer 364 is then etched (706). The photoresist layer is stripped and wafer 300 is cleaned (708). A barrier layer (not shown) is deposited (710) within the etched regions and metal contact plugs 368 are formed (712) by depositing Tungsten into the etched regions. A CMP step (714) removes any Tungsten above the level of ILD oxide 366. Wafer 300 is then cleaned and M1 structures and other back end structures are formed (716) following standard CMOS processing techniques.

Figure 24A:
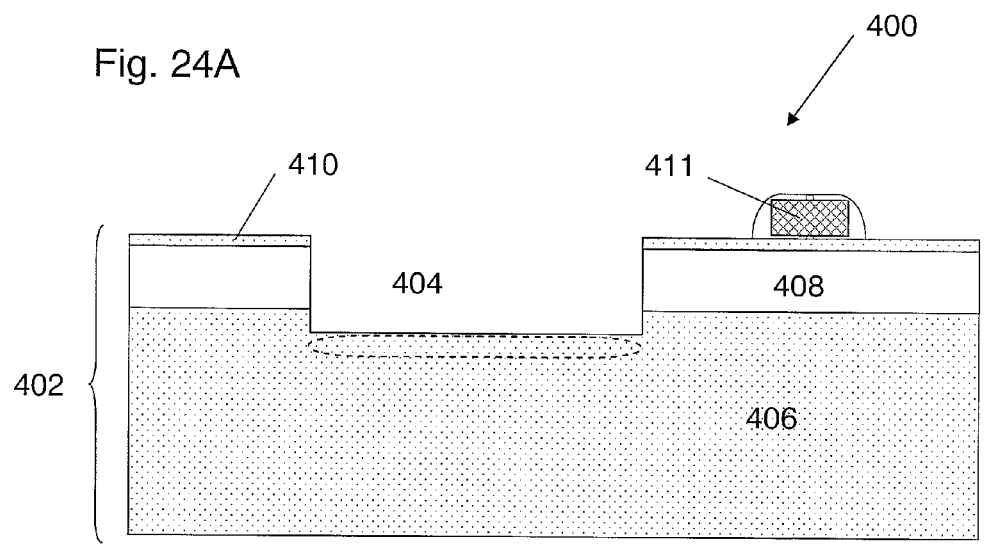
FIGS. 24A-24B are cross-sectional views of an alternative embodiment with a silicon-on-insulator (SOI) wafer.
Figure 24B:
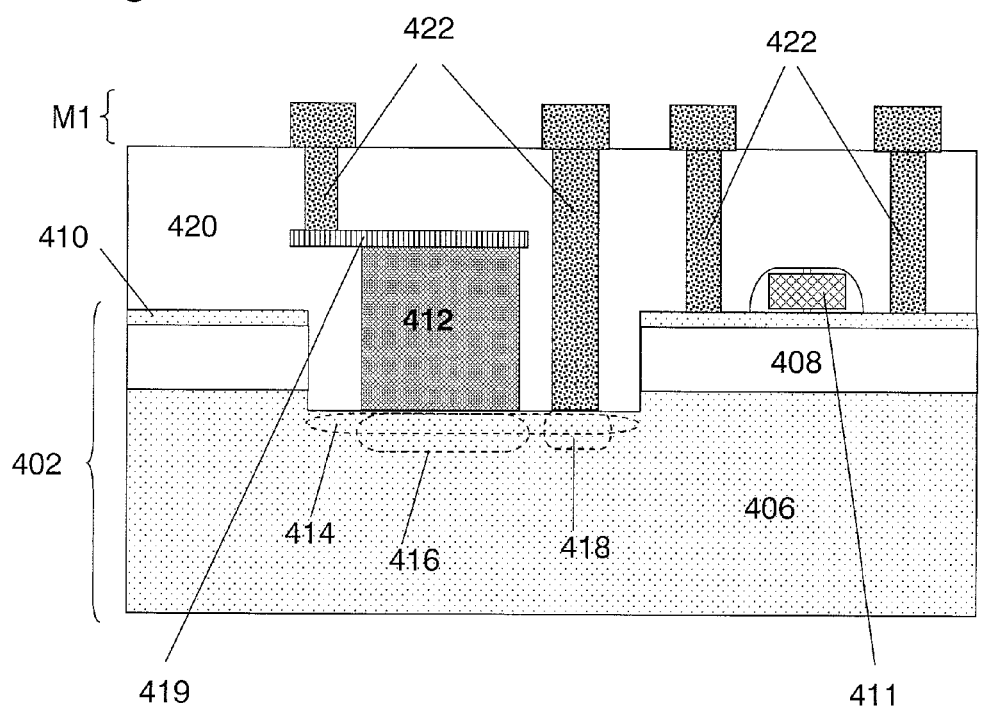

Referring to FIG. 24A, in an alternative embodiment, the photodetector and other integrated circuit components are fabricated on a silicon-on-insulator (SOI) wafer 400. An SOI substrate 402 is composed of a handling silicon wafer 406, an insulating $SiO_2$ layer 408, and a top silicon layer 410. The procedure for forming a pit 404 is substantially the same as the procedures described above. However, to form pit 404, the top silicon layer 410, the insulating $SiO_2$ layer 408, and the handling silicon wafer 406 must all be etched. The base of pit 404 lies within handling silicon wafer 406. A transistor 411 is fabricated either before or during the formation of pit 404. After the formation of pit 404, the implantation steps, the processing of detector body 412 (including the doping of bottom contact regions 414, 416, and 418 and the deposition of a top contact 419 and an insulating layer 420) and the fabrication of metal plugs 422, M1 structures, and other integrated circuit components proceeds as described above, resulting in a structure such as that shown in FIG. 24B.

Figure 25A:
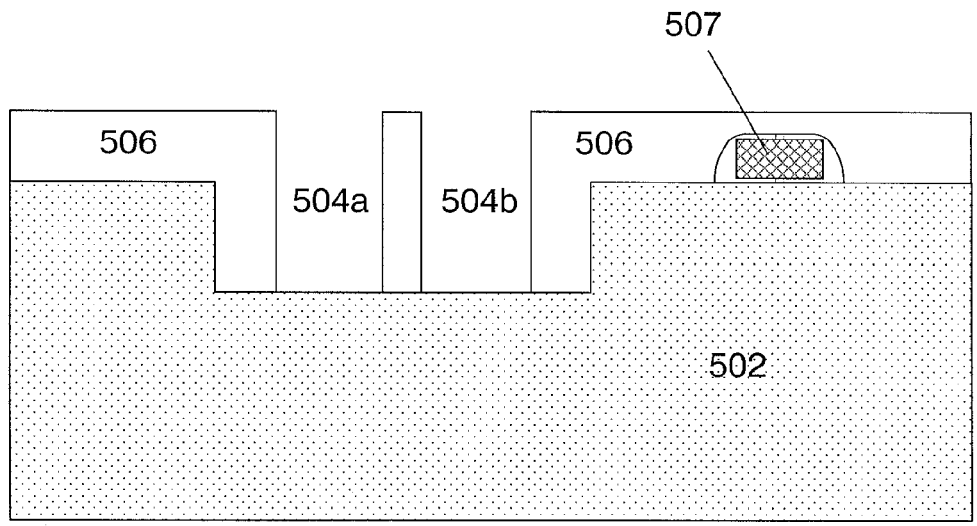
FIGS. 25A-25D are cross-sectional views of a further embodiment with a photodetector configured for horizontal carrier collection.
Figure 25B:
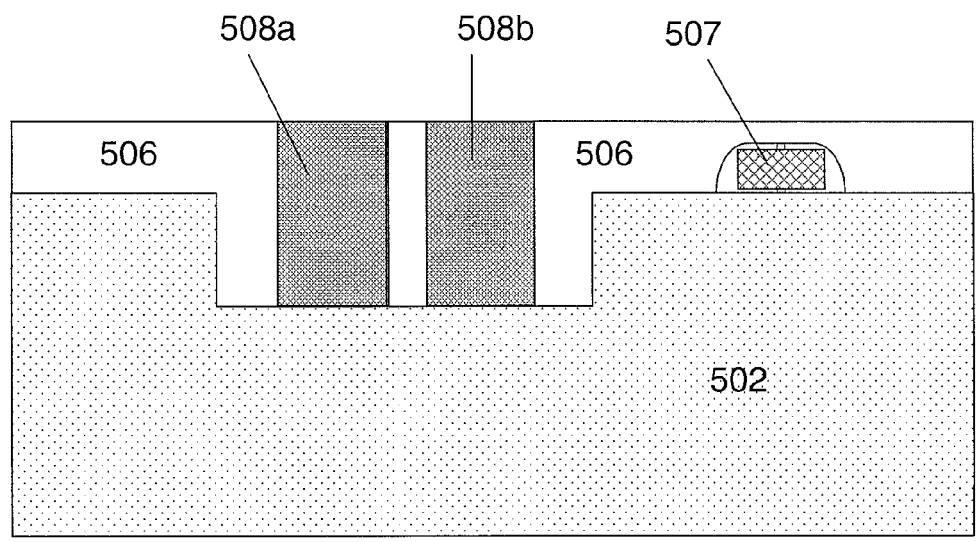
Figure 25C:
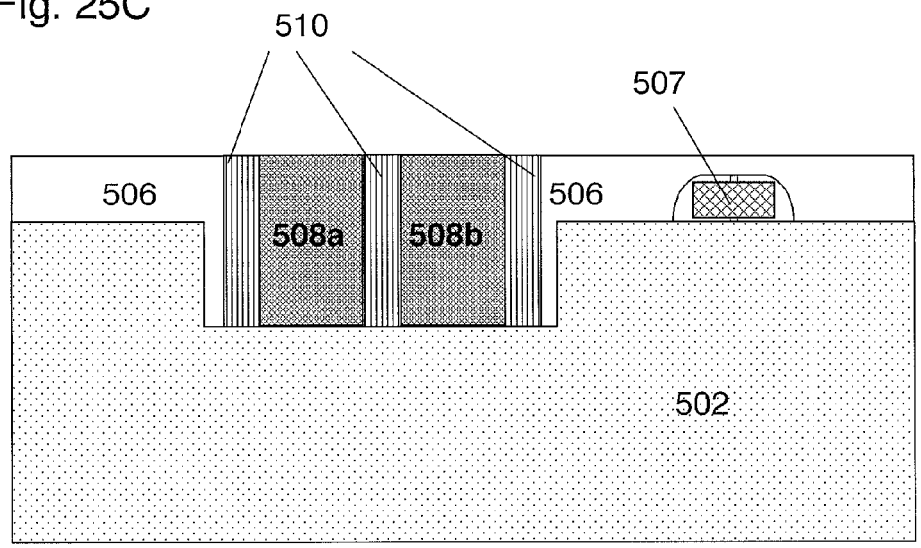
Figure 25D:
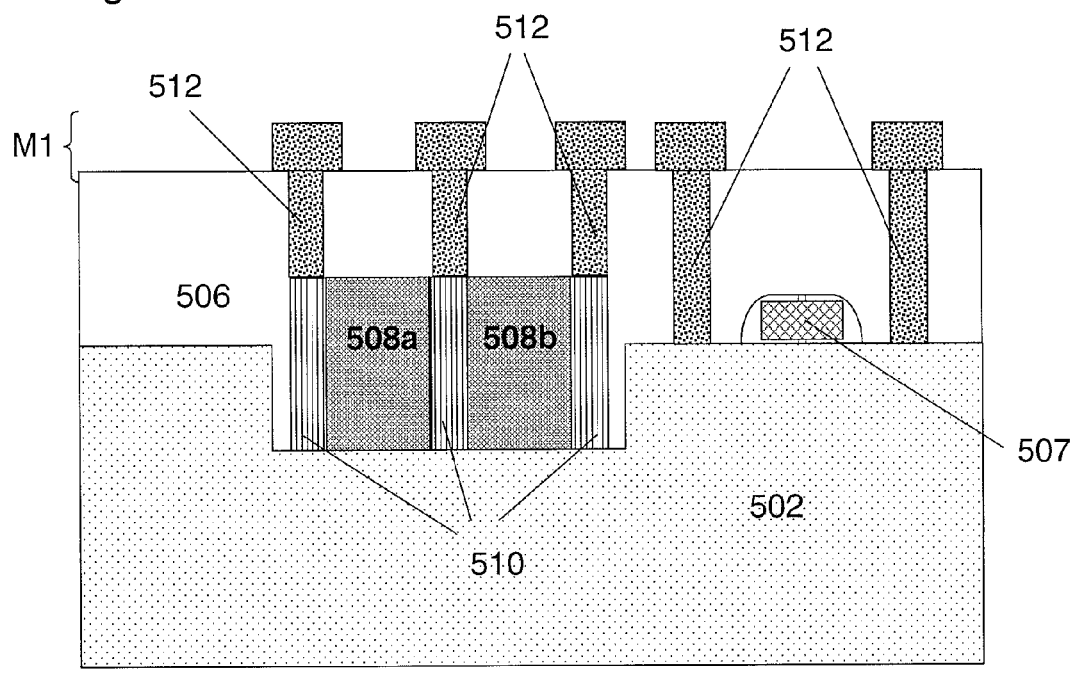

In a further embodiment, photon induced carriers in the photodetector body are collected horizontally rather than vertically. Referring to FIG. 25A, two pits 504a and 504b are formed in a silicon substrate 502 covered with an oxide layer 506 using methods described above. A transistor 507 may also be fabricated. Two photodetector bodies 508a and 508b, composed of either Si or SiGe, are grown in pits 504a and 504b, respectively, as shown in FIG. 25B. Portions of oxide layer 506 adjacent to photodetector bodies 504a and 504b are removed using wet etching or dry etching techniques to form trenches. Referring to FIG. 25C, polysilicon or amorphous silicon is deposited into the trenches to form side contacts 510. Further processing of metal plugs 512 and other integrated circuit components, as shown in FIG. 25D, proceeds according to methods described above. In this configuration, photon induced carriers in photodetector bodies 508a and 508b are collected laterally by side contacts 510. Such a configuration is useful for fabricating interdigitated lateral photodetectors.

Figure 26:
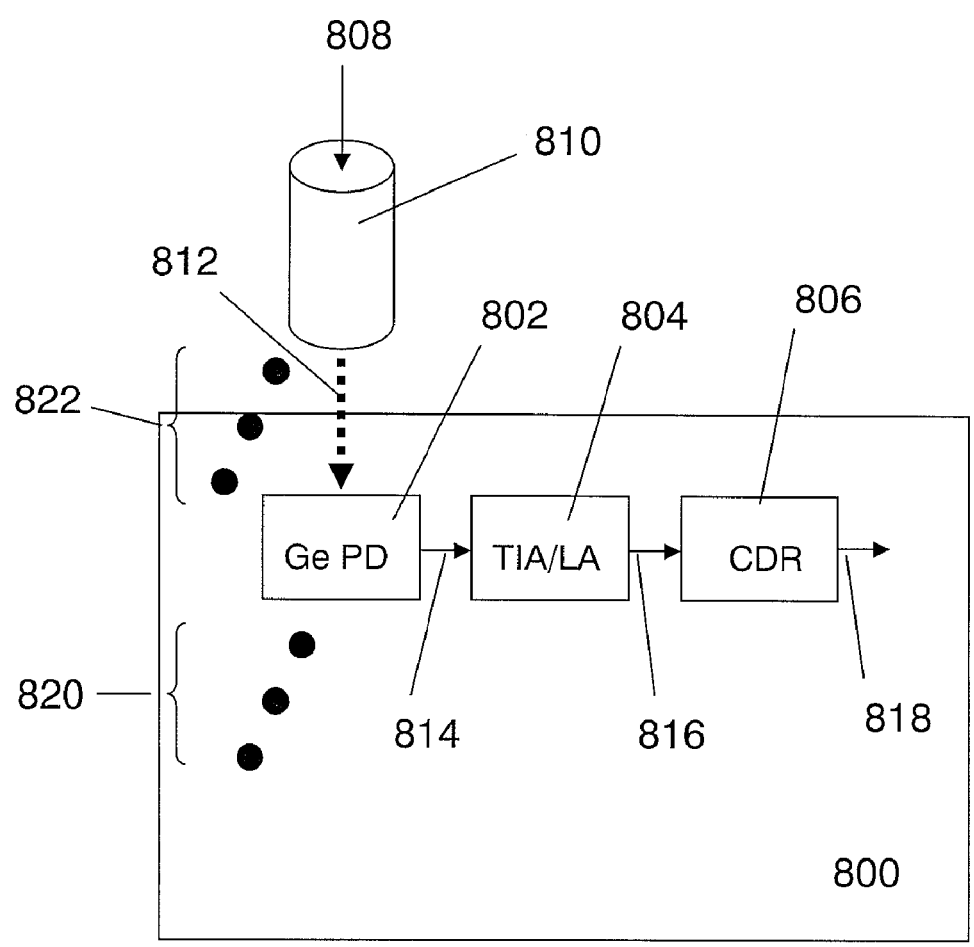
FIG. 26 is a schematic diagram of a CMOS integrated circuit.

Referring to FIG. 26, in some embodiments, a CMOS integrated circuit 800 incorporates a Ge or SiGe photodetector 802 with a companion amplification circuit 804, which may include a transimpedance amplifier (TIA) and a limiting amplifier (LA), and a reshaping circuit 806, such as a clock and data recovery circuit (CDR). Light 808 carrying a digital signal is transmitted through an optical fiber 810, which couples the light 812 through the top of the CMOS integrated circuit 800 into on-chip photodetector 802. Photodetector 802 converts the light signal to an electrical photocurrent 814, which is amplified by amplification circuit 804 to be a voltage signal 816. The clock and digital information carried by the original light signal is then recovered through CDR circuit 806 to produce an output signal 818. CMOS integrated circuit may also include arrays 820 of photodetectors 802, each photodetector having a companion amplification circuit 804 and reshaping circuit 806, each photodetector receiving light from one of an array 822 of optical fibers 810. This monolithically integrated optoelectronic circuit may be used as an optical receiver in an optical communication system.

Other embodiments are also within the scope of the invention. It is to be understood that the foregoing description is intended to illustrate and not to limit the scope of the invention, which is defined by the following claims.

What is claimed is:

1. A method comprising:
    forming a pit in a top surface of a semiconductor substrate by removing a portion of the semiconductor substrate, the pit having a base recessed in the top surface of the semiconductor substrate;
    fabricating an integrated circuit on the top surface of the semiconductor substrate, the integrated circuit comprising at least one layer of metal interconnects; and
    growing a semiconductor material with a bottom surface on the base of the pit, a top surface of the semiconductor material being higher than the top surface of the semiconductor substrate and lower than a bottom surface of a lowest layer of metal interconnects, wherein the semiconductor material comprises a photodetector.

2. The method of claim 1, further comprising forming active electronic components on the top surface of the substrate, the active electronic components electrically coupled to the photodetector.

3. The method of claim 1, further comprising doping at least a portion of the base of the pit prior to growing the semiconductor material.

4. The method of claim 3, wherein the at least a portion of the base of the pit is configured to be an electrode of the semiconductor material.

5. The method of claim 1, further comprising:
forming a dielectric layer on top of at least a portion of the substrate prior to growing the semiconductor material, the portion of the substrate including the pit; and
generating a hole in the dielectric layer in the region of the pit,
wherein the semiconductor material is grown in the hole in the dielectric layer.

6. The method of claim 5, wherein the dielectric layer comprises at least one of silicon dioxide ($SiO_2$), silicon oxide ($SiO_x$), silicon nitride ($Si_xN_y$), or silicon oxynitride ($SiO_xN_y$).

7. The method of claim 5, wherein the dielectric layer comprises a plurality of sublayers, each sublayer including at least one of silicon dioxide ($SiO_2$), silicon oxide ($SiO_x$), silicon nitride ($Si_xN_y$), or silicon oxynitride ($SiO_xN_y$).

8. The method of claim 1, wherein the pit is formed by at least one of dry chemical etching, wet chemical etching, dry thermal oxidation, or wet thermal oxidation.

9. The method of claim 1, wherein forming the pit comprises:
depositing a mask on the top surface of the substrate, the mask defining the portion of the substrate to be removed;
oxidizing the portion of the substrate to be removed by wet or dry oxidation; and
removing at least a part of an oxide formed by the oxidation of the portion of the substrate.

10. The method of claim 9, wherein the oxide is removed by chemical mechanical polishing.

11. The method of claim 9, wherein the oxide is removed by at least one of wet chemical etching or dry chemical etching.

12. The method of claim 9, wherein the mask comprises at least one of silicon nitride ($Si_xN_y$), silicon oxynitride ($SiO_xN_y$), silicon dioxide ($SiO_2$), or silicon oxide ($SiO_x$).

13. The method of claim 1, wherein the integrated circuit is fabricated using CMOS processing or CMOS compatible processing.

14. The method of claim 1, wherein the step of growing the semiconductor material occurs after front-end processing of the integrated circuit and prior to back-end processing of the integrated circuit.

15. The method of claim 14, wherein front-end processing comprises fabricating at least one metal-oxide-semiconductor (MOS) transistor.

16. The method of claim 15, wherein the bottom surface of the semiconductor material is lower than a bottom surface of a gate oxide of the at least one MOS transistor.

17. The method of claim 16, wherein the bottom surface of the semiconductor material is at least 50 nm lower than the bottom surface of the gate oxide of the at least one MOS transistor.

18. The method of claim 16, wherein the bottom surface of the semiconductor material is at least 200 nm lower than the bottom surface of the gate oxide of the at least one MOS transistor.

19. The method of claim 15, wherein a top surface of the semiconductor material is lower than a top surface of the at least one MOS transistor.

20. The method of claim 14, wherein back-end processing comprises fabricating at least one layer of metal interconnects.

21. The method of claim 1, further comprising growing polysilicon or amorphous silicon on top of the semiconductor material.

22. The method of claim 21, further comprising doping at least a portion of the polysilicon or amorphous silicon.

23. The method of claim 22, wherein the at least a portion of the polysilicon or amorphous silicon is configured to be an electrode of the semiconductor material.

24. The method of claim 1, further comprising growing polysilicon or amorphous silicon on at least one side of the semiconductor material.

25. The method of claim 1, wherein the semiconductor material comprises Ge or SiGe.

26. The method of claim 1, wherein the semiconductor material is grown to a thickness of at least 0.5 μm.

27. The method of claim 1, wherein the substrate comprises silicon or silicon-on-insulator.

28. A structure, comprising:
a semiconductor substrate having a top surface, the semiconductor substrate including at least one pit having a base lower than the top surface of the semiconductor substrate; an integrated circuit fabricated on the top surface of the semiconductor substrate, the integrated circuit comprising at least one layer of metal interconnects; and
a semiconductor material having a bottom surface formed on the base of the pit, a top surface of the semiconductor material being higher than the top surface of the semiconductor substrate and lower than a bottom surface of a lowest layer of metal interconnects, wherein the semiconductor material comprises a photodetector.

29. The structure of claim 28, further comprising active electronic components formed on the top surface of the substrate, the active electronic components electrically coupled to the photodetector.

30. The structure of claim 29, wherein at least a portion of the base of the pit is doped.

31. The structure of claim 30, wherein at least a portion of the base of the pit is configured to be an electrode of the semiconductor material.

32. The structure of claim 28, wherein an efficiency of the photodetector is at least 95%.

33. The structure of claim 28, wherein the semiconductor material comprises Ge or SiGe.

34. The structure of claim 28, wherein the semiconductor material is at least 0.5 μm thick.

35. The structure of claim 28, wherein the integrated circuit comprises at least one MOS transistor.

36. The structure of claim 35, wherein the top surface of the semiconductor material is lower than a top surface of the at least one MOS transistor.

37. The structure of claim 28, further comprising a layer of an insulator substantially covering the substrate.

38. The structure of claim 28, wherein the substrate comprises silicon or silicon-on-insulator.

39. The structure of claim 28, further comprising a layer of polysilicon or amorphous silicon on top of the semiconductor material.

40. The structure of claim 39, wherein at least a portion of the polysilicon or amorphous silicon is doped.

41. The structure of claim 40, wherein the at least a portion of the polysilicon or amorphous silicon is configured to be an electrode of the semiconductor material.

42. The structure of claim 28, further comprising a layer of polysilicon or amorphous silicon on at least one side of the semiconductor material.

43. An electro-optical system comprising:
at least one integrated device including:
a photodetector body having a bottom surface formed on the base of a pit in a semiconductor substrate; and active electronic components fabricated on the semiconductor substrate and electrically coupled to the photodetector body, the photodetector body having a thickness selected such that a top surface of the photodetector body is higher than a top surface of the semiconductor substrate and lower than a metallization layer of the active electronic components.

44. The electro-optical system of claim 43, further comprising an optical fiber coupled to the photodetector body.

45. The electro-optical system of claim 43, comprising a plurality of integrated devices.

46. The electro-optical system of claim 43, wherein the active electronic components are configured to amplify a signal detected by the photodetector body.

47. The electro-optical system of claim 46, wherein the active electronic components are further configured to reshape the signal detected by the photodetector body.

48. The electro-optical system of claim 43, wherein the active electronic components include a digital microprocessor.

49. The structure of claim 28, wherein the semiconductor material comprises a photodetector body of a photodetector.

50. The structure of claim 28, further comprising a contact layer on the top surface of the semiconductor material and below the bottom surface of the lowest layer of metal interconnects.

51. The structure of claim 50, further comprising a layer of an insulator substantially covering at least a portion of the base of the pit and at least a portion of the top surface of the semiconductor substrate.

52. The structure of claim 51, further comprising conducting material forming a conducting path between the lowest layer of metal interconnects and the contact layer on the top surface of the semiconductor material.

* * * * *